(12) United States Patent
Taylor et al.

(10) Patent No.: US 8,027,187 B2
(45) Date of Patent: Sep. 27, 2011

(54) MEMORY SENSING DEVICES, METHODS, AND SYSTEMS

(75) Inventors: Jennifer E. Taylor, Boise, ID (US); John David Porter, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 396 days.

(21) Appl. No.: 12/209,923

(22) Filed: Sep. 12, 2008

(65) Prior Publication Data

US 2010/0067286 A1   Mar. 18, 2010

(51) Int. Cl.
*G11C 11/00* (2006.01)
(52) U.S. Cl. .................. 365/163; 365/148; 365/207
(58) Field of Classification Search .................. 365/163, 365/148, 207, 211, 189.09, 158, 230.03, 365/189.05, 203, 185.21, 171, 189.07, 225.6
See application file for complete search history.

(56) References Cited

U.S. PATENT DOCUMENTS

| 6,577,549 | B1 * | 6/2003 | Tran et al. ............ 365/211 |
| 7,405,965 | B2 | 7/2008 | Choi et al. |
| 2003/0156457 | A1 * | 8/2003 | Ooishi ............ 365/185.21 |
| 2004/0174746 | A1 * | 9/2004 | Bedarida et al. ......... 365/185.21 |
| 2006/0092689 | A1 * | 5/2006 | Braun et al. ............ 365/158 |
| 2008/0025111 | A1 * | 1/2008 | Choy et al. ............ 365/189.09 |
| 2008/0055972 | A1 | 3/2008 | Oh et al. |

OTHER PUBLICATIONS

Miao, X. S., et al. "Temperature Dependence of Phase-Change Random Access Memory Cell," Jpn. J. App. Phys., pp. 3955-3958, vol. 45, No. 5A. (2006).

* cited by examiner

*Primary Examiner* — Dang Nguyen
(74) *Attorney, Agent, or Firm* — Brooks, Cameron & Huebsch, PLLC

(57) ABSTRACT

The present disclosure includes devices, methods, and systems for sensing memory, such as resistance variable memory, among other types of memory. One or more embodiments can include a method for generating currents to be used in sensing a memory cell, the method including providing a number of initial currents, and generating a number of reference currents by summing particular combinations of the initial currents.

13 Claims, 13 Drawing Sheets

320

THREE INITIAL CURRENTS

| INITIAL CURRENT | VALUE |
|---|---|
| IC 1 | 250nA |
| IC 2 | 875nA |
| IC 3 | 2uA |

330

FIVE GENERATED REFERENCE CURRENTS

| REFERENCE CURRENT | FORMULA | VALUE |
|---|---|---|
| READ REF 1 | IC 1 | 250nA |
| PROGRAM REF 1 | IC 1+IC 2 | 1.125uA |
| READ REF 2 | IC 1+2*(IC 2) | 2uA |
| PROGRAM REF 2 | IC 1+2*(IC 2)+IC 3 | 4uA |
| READ REF 3 | IC 1+2*(IC 2)+2*(IC 3) | 6uA |

MEMORY SENSING DEVICES, METHODS, AND SYSTEMS

TECHNICAL FIELD

The present disclosure relates generally to semiconductor memory devices, methods, and systems, and more particularly, to devices, methods, and systems for sensing semiconductor memory.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistance variable memory, among others.

Memory may be volatile or non-volatile. Volatile memory requires power to maintain the information stored therein, e.g., when power to volatile memory is lost, the information stored therein is also lost. Non-volatile memory, in contrast, does not lose the information stored therein in the absence of power, e.g., non-volatile memory may retain the information stored therein even if no power is being provided to the memory. Types of volatile memory include RAM, DRAM, and SDRAM, among others. Types of non-volatile memory include ROM, flash memory, and resistance variable memory, among others.

Types of resistance variable memory include programmable conductor memory, phase change random access memory (PCRAM), and resistive random access memory (RRAM), among others. A physical layout of a PCRAM memory device may resemble that of a DRAM device, with the capacitor of the DRAM cell being replaced by a phase change material, such as Germanium-Antimony-Telluride (GST). A physical layout of an RRAM memory device may include memory cells including a variable resistor thin film, e.g., a colossal magnetoresistive material, which may be connected to an access device, such as a diode, a field effect transistor (FET), or a bipolar junction transistor (BJT), for example.

The memory cell material of a PCRAM device, e.g., GST, for a single-level cell (SLC), may exist in an amorphous, higher resistance state, or a crystalline, lower resistance state. The resistance state of the PCRAM cell may be altered by applying sources of energy to the cell, such as current pulses or pulses of light, among other sources of energy. For example, the resistance state of the PCRAM cell may be altered by heating the cell with a programming current. This results in the PCRAM cell being programmed to a particular resistance state, which may correspond to a data state. In a binary system, for example, the amorphous, higher resistance state may correspond to a data state of 1, and the crystalline, lower resistance state may correspond to a data state of 0. However, the choice of these corresponding data states may be reversed, that is, in other binary systems, the amorphous, higher resistance state may correspond to a data state of 0, and the crystalline, lower resistance state may correspond to a data state of 1. The resistance state of an RRAM cell, e.g., the variable resistor thin film, may be increased and/or decreased by applying positive and/or negative electrical pulses across the film. This may result in the RRAM cell being programmed to a particular resistance state.

An SLC may represent two data states as represented by the binary digits 1 or 0. Memory cells may also be programmed to more than two data states, such as to a number of data states that allows a cell to represent more than two binary digits, e.g., 1111, 0111, 0011, 011, 1001, 0001, 0101, 1101, 1100, 0100, 0000, 1000, 1010, 0010, 0110, and 1110. Such cells may be referred to as multi state memory cells, multibit cells, or multilevel cells (MLCs). The memory cell material of a PCRAM device including MLCs may exist in a number of intermediate resistance states between what are generally considered to be amorphous and crystalline. MLCs may allow the manufacture of higher density memories without increasing the number of memory cells since each cell may represent more than one digit, e.g., more than one bit.

BRIEF DESCRIPTION OF THE DRAWINGS

FIG. 3 is a table of initial currents and a table of generated reference currents that can be used in a sensing operation in accordance with one or more embodiments of the present disclosure.

DETAILED DESCRIPTION

Devices, methods, and systems for sensing memory, such as resistance variable memory, among other types of memory, are described herein. One or more embodiments can include a method for generating currents to be used in sensing a memory cell, the method including providing a number of initial currents, and generating a number of reference currents by summing particular combinations of the initial currents.

In the following detailed description of the present disclosure, reference is made to the accompanying drawings that form a part hereof, and in which is shown by way of illustration how one or more embodiments of the disclosure may be practiced. These one or more embodiments are described in sufficient detail to enable those of ordinary skill in the art to practice the one or more embodiments of this disclosure, and it is to be understood that other embodiments may be utilized and that process, electrical, or mechanical changes may be made without departing from the scope of the present disclosure.

Figure 1:
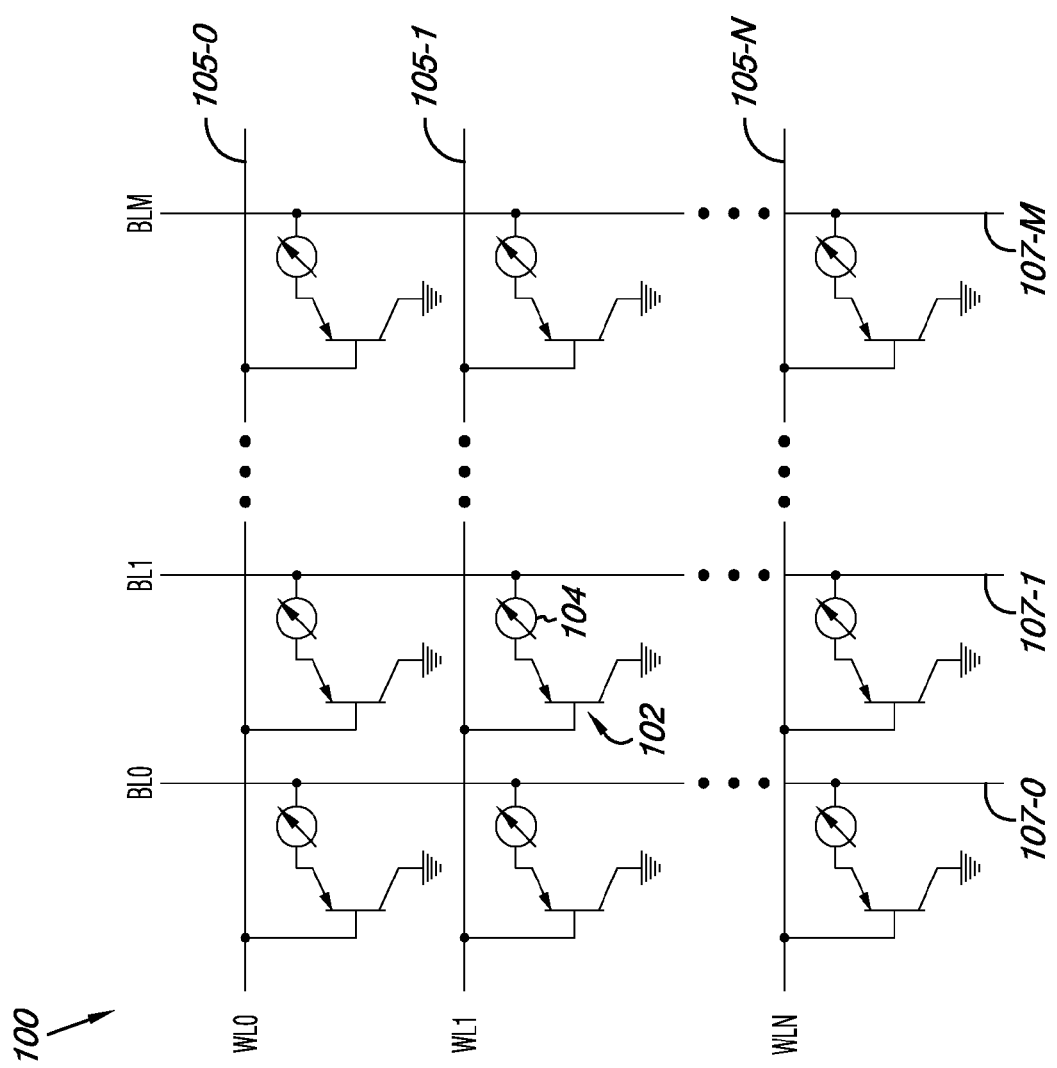
FIG. 1 is a schematic of a portion of a resistance variable memory array that can be used with one or more embodiments of the present disclosure.

FIG. 1 is a schematic of a portion of a resistance variable memory array 100 that can be used with one or more embodiments of the present disclosure. In the embodiment illustrated in FIG. 1, the memory array 100 includes a number of phase change memory cells each having an associated access device 102 and resistance variable element 104, e.g., a phase change material 104. The access devices 102 can be operated, e.g., turned on/off, to access the memory cells in order to perform operations such as programming and/or sensing, e.g., reading, operations on the resistance variable elements 104. In the embodiment illustrated in FIG. 1, the access devices 102 are PNP bipolar junction transistors (BJTs). Alternatively, access devices 102 can be NPN BJTs, diodes, and/or metal-oxide-semiconductor field-effect-transistors (MOSFETs), among other types of access devices, as will be appreciated by one of ordinary skill in the art.

As shown in FIG. 1, a base region of each BJT 102 associated with each memory cell is coupled to one of a number of access lines, such as word lines 105-0 (WL0), 105-1 (WL1), ..., 105-N (WLN), e.g., each word line 105-0, 105-1, ..., 105-N is coupled to a "row" of phase change memory cells. The designator "N" is used to indicate that a memory array can include a number of word lines. The use of the term "row" is not meant to imply a particular linear and/or horizontal orientation of the memory cells. Rather, a row can mean a number of memory cells coupled to a particular word line, regardless of the orientation of the memory cells. For example, a row can include a number of memory cells coupled to a particular word line in a staggered, non-linear orientation.

In one or more embodiments, the resistance variable elements 104 can be a phase change chalcogenide alloy such as a Germanium-Antimony-Tellurium (GST) material, e.g., a Ge—Sb—Te material such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include GeTe, In—Se, $Sb_2Te_3$, GaSb, InSb, As—Te, Al—Te, SbSe, Ge—Sb—Te, Ge—Sb—Se, Te—Ge—As, In—Sb—Te, Te—Sn—Se, Ge—Se—Ga, Bi—Se—Sb, Ga—Se—Te, Sn—Sb—Te, In—Sb—Ge, In—Sb—Se, Te—Ge—Sb—S, Te—Ge—Sn—O, Te—Ge—Sn—Au, Pd—Te—Ce—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ce—Te—Sn—Pt, and Ag—In—Sb—Se—Te, among various other phase change materials. However, embodiments of the present disclosure are not so limited, and can include impurities and/or the addition of other elements as well.

In the embodiment illustrated in FIG. 1, each resistance variable element 104 is coupled to one of a number of data lines, such as bit lines 107-0 (BL0), 107-1 (BL1), ..., 107-M (BLM), e.g., each bit line 107-0, 107-1, ..., 107-M is coupled to a "column" of phase change memory cells. The designator "M" is used to indicate that a memory array can include a number of bit lines. For ease of addressing in the digital environment, the number of word lines 105-1, ..., 105-N and the number of bit lines 107-1, ..., 107-M can each be some power of two, e.g., 256 word lines by 4,096 bit lines. However, embodiments are not limited to particular numbers of word lines and/or bit lines. Further, the use of the term "column" is not meant to imply a particular linear and/or vertical orientation of the memory cells. Rather, a column can mean a number of memory cells coupled to a particular bit line, regardless of the orientation of the memory cells. For example, a column can include a number of memory cells coupled to a particular bit line in a staggered, e.g., non-linear, fashion.

In operation, appropriate voltage and/or current signals, e.g., pulses, can be applied to the bit lines 107-0, 107-1, ..., 107-M and/or word lines 105-0, 105-1, ..., 105-N in order to program data to and/or sense, e.g., read, data from the phase change memory cells of the array 100. Sensing operations in accordance with the present disclosure will be further described herein.

Embodiments of the present disclosure are not limited to the example array 100 illustrated in FIG. 1. For example, a memory array can have an architecture other than that illustrated in FIG. 1, as will be understood by one of ordinary skill in the art. Further, as one of ordinary skill in the art will appreciate, the phase change memory array 100 can be coupled to programming circuitry and/or sensing circuitry (not shown in FIG. 1). Sensing circuitry in accordance with the present disclosure will be further described herein.

The number of phase change memory cells shown in memory array 100 can be single level cells (SLCs) and/or multilevel cells (MLCs). A single level phase change memory cell can be programmed to a generally more amorphous (reset) state or a generally more crystalline (set) state. Such reset and/or set states can correspond to a binary 0 and/or 1. A reset pulse can include a relatively high current pulse applied to the cell for a relatively short period of time. The current applied to the cell can be quickly reduced after the phase change material "melts," allowing the cell to cool quickly into a more amorphous state where atomic motion that can allow crystallization generally occurs to a lesser degree due, at least in part, due to relatively rapid cooling of the material. Conversely, a set pulse can include a relatively lower current pulse applied to the cell for a relatively longer period of time with a slower quenching speed, e.g., the current can be more slowly reduced allowing the phase change material greater time to cool. Accordingly, the material can crystallize to a greater degree than after the reset pulse. Some phase change materials can have a greater resistivity associated with a more amorphous state and a lesser resistivity associated with a more crystalline state.

Multilevel phase change memory cells can be programmed to one or more intermediate states between amorphous and crystalline. For example, multilevel phase change memory cells can be programmed to various levels of structural order. Through application of one or more programming pulses at particular current levels, the cells can be programmed to a given resistance state. With appropriate programming currents, the cells can be programmed to one or more intermediate states having a partial amorphous and a partial crystalline structure, providing for multilevel resistance states. The number of data states chosen for a particular cell can be based on, for example, the desired application, design and process limits, e.g., programming time, sensing time, and accuracy of sensing circuitry, and other factors.

Figure 2:
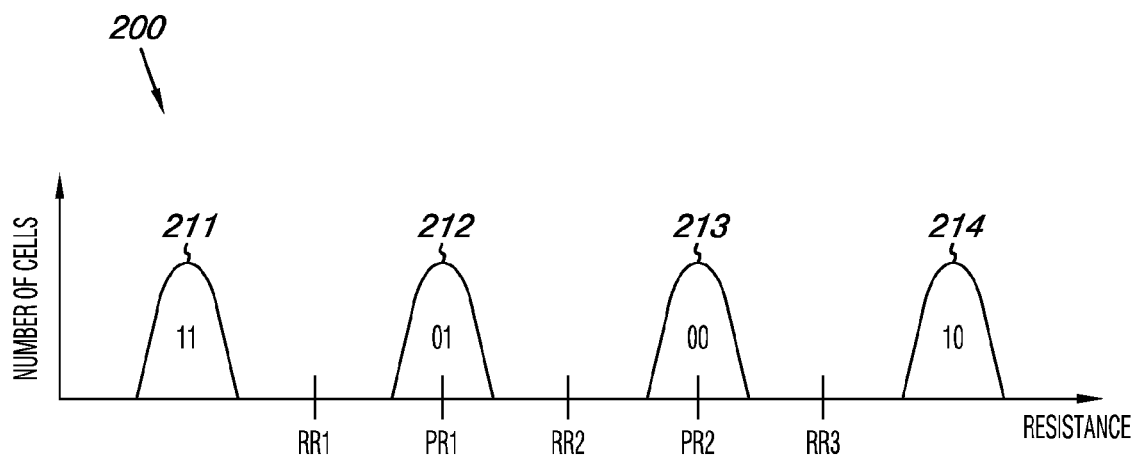
FIG. 2 is a graph illustrating various data states for a number of multilevel phase change memory cells that can be sensed in accordance with one or more embodiments of the present disclosure.

FIG. 2 is a graph 200 illustrating various data states for a number of multilevel phase change memory cells that can be sensed in accordance with one or more embodiments of the present disclosure.

Graph 200 illustrates four resistance distributions, e.g., 211, 212, 213, and 214. Each resistance distribution includes a number of memory cells programmed to a corresponding data state, and each memory cell in a particular resistance distribution is programmed to a resistance that falls within a range of resistances corresponding to a particular data state. As shown in FIG. 2, each resistance distribution represents memory cells programmed to a particular data state, e.g., 11, 01, 00, and 10. That is, resistance distribution 211 represents those memory cells programmed to a data state of 11, resistance distribution 212 represents those memory cells programmed to a data state of 01, resistance distribution 213 represents those memory cells programmed to a data state of 00, and resistance distribution 214 represents those memory cells programmed to a data state of 10. However, as will be appreciated by one of skill in the art, embodiments are not limited to the above example association between resistance distributions and particular data states. For example, resistance distribution 211 could represent those memory cells programmed to a data state of 10, resistance distribution 212 could represent those memory cells programmed to a data state of 00, resistance distribution 213 could represent those memory cells programmed to a data state of 01 and resistance distribution 214 could represent those memory cells programmed to a data state of 11.

In one or more embodiments, the resistance distributions which include memory cells programmed to an intermediate, e.g., partially amorphous and partially crystalline, state can be wider, e.g., the range of resistances corresponding to an intermediate state can be wider, than the resistance distributions which include memory cells programmed to a mostly amorphous and/or a mostly crystalline state. For example, in one or more embodiments, resistance distributions 212 and/or 213 can be wider than resistance distributions 211 and/or 214. A wider resistance distribution can require a greater margin in programming and/or sensing the data state associated with the wider resistance distribution, as will be appreciated by one of ordinary skill in the art.

The data state of a phase change memory cell can be determined by sensing a voltage and/or current associated with the cell. A sensing operation of a memory cell can involve a number of reference currents, which can be associated with a number of data states. A number of reference currents can be associated with a number of data states that can be used in a sensing operation in accordance with one or more embodiments of the present disclosure. A sensing operation can include a program verify operation and/or a data read operation. A program verify operation can use one or more program reference currents, and a data read operation can use one or more read reference currents. That is, both program reference currents and read reference currents can be considered reference currents. Graph 200 illustrates program reference currents PR1 and PR2, as well as read reference currents RR1, RR2, and RR3. Each program reference current, e.g., PR1 and PR2, and each read reference current, e.g., RR1, RR2, and RR3, can be associated with a particular data state, as illustrated in FIG. 2.

A program verify operation can be performed following one or more programming pulses to help determine whether a memory cell has been programmed to a desired data state, e.g., to a resistance that falls within a range of resistances corresponding to the desired data state. For example, memory cells that were intended to be programmed to the 01 data state can have their data state verified with program reference current PR1, which is associated with a resistance located approximately at the center of resistance distribution 212. Similarly, program reference current PRC, which is associated with a resistance located approximately at the center of resistance distribution 213, can be used to verify the data state of memory cells which were intended to be programmed to the 00 data state. Additional program reference currents (not shown in FIG. 2) can also be used to verify the data state of memory cells which were intended to be programmed to the 11 and 10 data states.

A data read operation can include a comparison of a voltage and/or current associated with a memory cell with one or more reference voltages and/or one or more read reference currents, e.g., RR1, RR2, and RR3, in order to determine the data state of the memory cell. For example, a voltage and/or current associated with the cell can be the voltage and/or current output from the cell when the cell is selected, e.g., when the cell is "turned on." A cell can be selected, e.g., "turned on," by biasing an access line corresponding to the selected cell at a first particular voltage, e.g., 0.0V, and a data line corresponding to the selected cell at a second particular voltage, e.g., 0.3V, in order to detect current flow across the phase change material of the cell. The voltage and/or current output from the selected cell, at least partially in response to the biasing voltages, can depend on the data state to which the cell has been programmed. For example, a selected cell that has been programmed to a data state corresponding to a higher resistance state can have a higher voltage and/or lower current output, while a selected cell that has been programmed to a data state corresponding to a lower resistance state can have a lower voltage and/or higher current output. Accordingly, the voltage and/or current associated with the programmed data state of the selected cell, e.g., the output of the selected cell, can be compared to one or more generated reference levels, e.g., one or more reference voltages and/or one or more read reference currents, in order to determine the data state of the cell.

For example, a data read operation of a two bit phase change memory cell can include a comparison of a current associated with the two bit cell with two read reference currents. In such a data read operation, a current output of the two bit cell can first be compared with a first read reference current, e.g., RR2, associated with a first data state. The current output of the two bit cell can then be compared with a second read reference current, e.g., RR1 or RR3, associated with a second data state in order to determine the data state of the cell. The read reference current used in the second comparison can be dictated by the result of the first comparison. For example, if the first comparison indicates that the current output of the two bit cell is lower than RR2, RR3 can be used as the read reference current in the second comparison, but if the first comparison indicates that the current output of the two bit cell is greater than RR2, RR1 can be used as the read reference current in the second comparison.

Embodiments of the present disclosure are not limited to the sensing operation of the previously discussed example, and are not limited to the two bit phase change memory cells described in connection with FIG. 2. Rather, embodiments of the present disclosure can include other sensing operations, and can include sensing single level phase change memory cells and/or multilevel phase change memory cells having other numbers of data states.

The resistance of the phase change material of a phase change memory cell can be temperature dependent. For example, the resistance of the phase change material can decrease as the temperature of the memory cell increases. Because current is inversely proportional to resistance, a current output from the memory cell during a sensing operation, e.g., a program verify current output from the cell during a program verify operation and/or a current output from the cell when the cell is selected during a data read operation, can increase as the temperature of the memory cell increases. In one or more embodiments of the present disclosure, the reference currents, e.g., the program reference currents and/or the read reference currents, can track the temperature dependence of the phase change material in order to ensure accuracy during a sensing operation. For example, in one or more embodiments of the present disclosure, the reference currents can be temperature compensated to reflect the temperature dependence of the current output from the memory cell during a sensing operation. Temperature compensation of the reference currents, e.g., the program reference currents and/or the read reference currents, is further described herein.

In one or more embodiments of the present disclosure, the reference currents, e.g., program reference currents PR1 and PR2 and read reference currents RR1, RR2 and RR3, can be generated by summing particular combinations of a number of initial currents. For example, in one or more embodiments, the reference currents, e.g., the program reference currents and read reference currents, can be based on the initial currents. In one or more embodiments, the number of initial currents can be less than a sum of the number of program reference currents and read reference currents. For example, in one or more embodiments, the number of initial currents can be three, the number of program reference currents can be two, and the number of read reference currents can be three, as will be further described herein.

Generating the reference currents by summing particular combinations of a number initial currents can reduce the amount of circuitry required for operation of a memory device. Reducing the amount of circuitry required for a memory device can reduce the power required to operate the memory device. Reducing the amount of circuitry can also reduce the area of the memory device, and/or provide additional space in the memory device.

FIG. 3 is a table 320 of initial currents and a table 330 of generated reference currents that can be used in a sensing operation of a two-bit phase change memory cell in accordance with one or more embodiments of the present disclosure.

Table 320 illustrates three initial currents, e.g., IC 1, IC 2, and IC 3. Column 322 includes the three initial currents, and column 324 includes an example value, e.g., magnitude, of each initial current. As shown in table 320, IC 1 has a value of 250 nA, IC 2 has a value of 875 nA, and IC 3 has a value of 2 uA.

Table 330 illustrates five generated reference currents. For example, table 330 illustrates two program reference currents, e.g., Program Ref 1 and Program Ref 2, and three read reference currents, e.g., Read Ref 1, Read Ref 2, and Read Ref 3. Column 332 includes the five reference currents, column 334 includes an example embodiment for a formula used to obtain each reference current, and column 336 includes an example value, e.g., magnitude, for each reference current. As shown in table 330, the value of Read Ref 1 is equal to the value of IC 1, e.g., 250 nA, the value of Program Ref 1 is equal to the sum of IC 1 and IC 2, e.g., 1.125 uA, the value of Read Ref 2 is equal to the sum of IC 1 and twice IC 2, e.g., 2 uA, the value of Program Ref 2 is equal to the sum of IC 1, twice IC 2, and IC 3, e.g., 4 uA, and the value of Read Ref 3 is equal to the sum of IC 1, twice IC 2, and twice IC 3, e.g., 6 uA.

The relationship between the read reference currents and program reference currents illustrated in table 330 is such that the value, e.g., magnitude, of each program reference current is centered between the magnitudes of two of the read reference currents. For example, the magnitude of Program Ref 1 is centered between Read Ref 1 and Read Ref 2, and the magnitude of Program Ref 2 is centered between Read Ref 2 and Read Ref 3. However, embodiments of the present disclosure are not so limited, and can include any relationship between the read reference currents and the program reference currents. For example, the relationship between the read reference currents and the program reference currents can be such that one or more data states are favored over the other data states. As used herein, a data state is favored if its corresponding range of resistances is wider, e.g., includes a greater number of resistance values, than the other data states of the memory cell. For example, with reference to FIG. 2, data states 01 and 00 would be favored if their resistance distributions, e.g., 212 and 213, were wider than the resistance distributions for data states 11 and 10, e.g., 211 and 214. Favoring a data state can allow for a greater margin in programming and/or sensing the data state, as will be appreciated by one of ordinary skill in the art.

Although table 320 illustrates three initial currents and table 330 illustrates five reference currents, embodiments of the present disclosure are not so limited, and can include different numbers of initial currents and/or reference currents. Further, the number of reference currents can include different combinations of program reference currents and read reference currents. Also, embodiments of the present disclosure are not limited to the example formulas and/or values for the initial currents and/or reference currents illustrated in tables 320 and 330.

Figure 4:
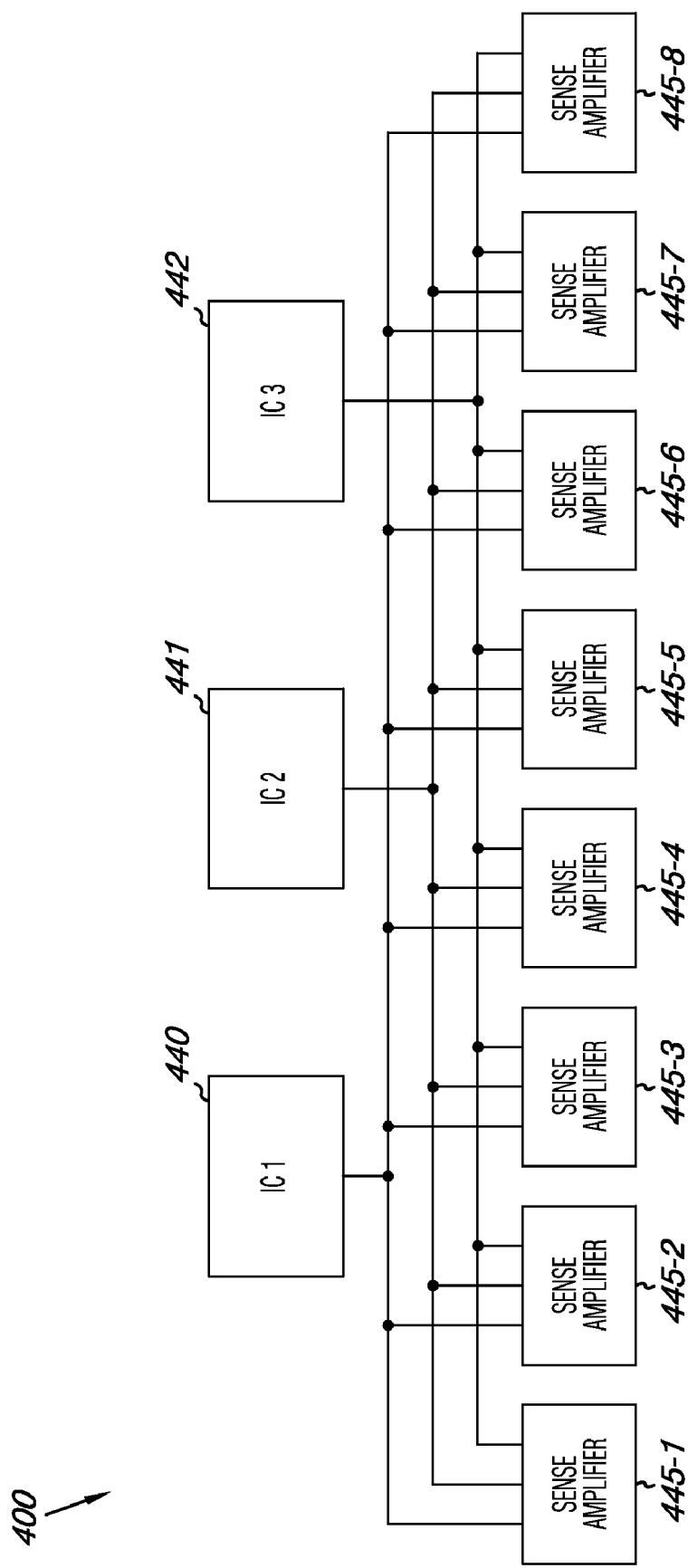
FIG. 4 illustrates a block diagram for providing and routing initial currents in accordance with one or more embodiments of the present disclosure.

FIG. 4 illustrates block diagram 400 for providing and routing initial currents in accordance with one or more embodiments of the present disclosure. Circuitry 400 includes initial current providers 440, 441, and 442. Circuitry 400 also includes sense circuitry, e.g., sense amplifiers 445-1, 445-2, 445-3, 445-4, 445-5, 445-6, 445-7, and 445-8.

As shown in FIG. 4, initial current providers 440, 441, and 442 are coupled to each sense amplifier 445-1, 445-2, 445-3, 445-4, 445-5, 445-6, 445-7, and 445-8. Each sense amplifier can be selectively coupled to one or more memory cells, e.g., the resistance variable memory cells of memory array 100 shown in FIG. 1, via one or more access lines, e.g., word lines 105-0, 105-1, . . . , 105-N shown in FIG. 1, and/or one or more data lines, e.g., bit lines 107-0, 107-1, . . . , 107-N shown in FIG. 1.

Initial current providers 440, 441, and 442 can provide an initial current, e.g., IC 1, IC 2, and IC 3, respectively, for use in sensing operations in accordance with the present disclosure. The initial current can be applied to the sense amplifiers, as shown in FIG. 4. In one or more embodiments, the initial current can be temperature compensated, as will be farther described herein. Sense amplifiers 445-1, 445-2, 445-3, 445-4, 445-5, 445-6, 445-7, and 445-8 can generate reference currents, e.g., program reference currents and read reference currents, based on one or more of the initial currents in accordance with one or more embodiments of the present disclosure. The sense amplifiers and initial current providers will be further described herein.

Although FIG. 4 illustrates three initial current providers, embodiments of the present disclosure are not so limited, and can include different numbers of initial current providers. Additionally, although FIG. 4 illustrates each initial current provider as providing one initial current, embodiments are of the present disclosure are not so limited, and can include initial current providers which provide a number of initial currents. Also, although FIG. 4 illustrates eight sense amplifiers, embodiments of the present disclosure are not so limited, and can include different numbers of sense amplifiers.

Figure 5A:
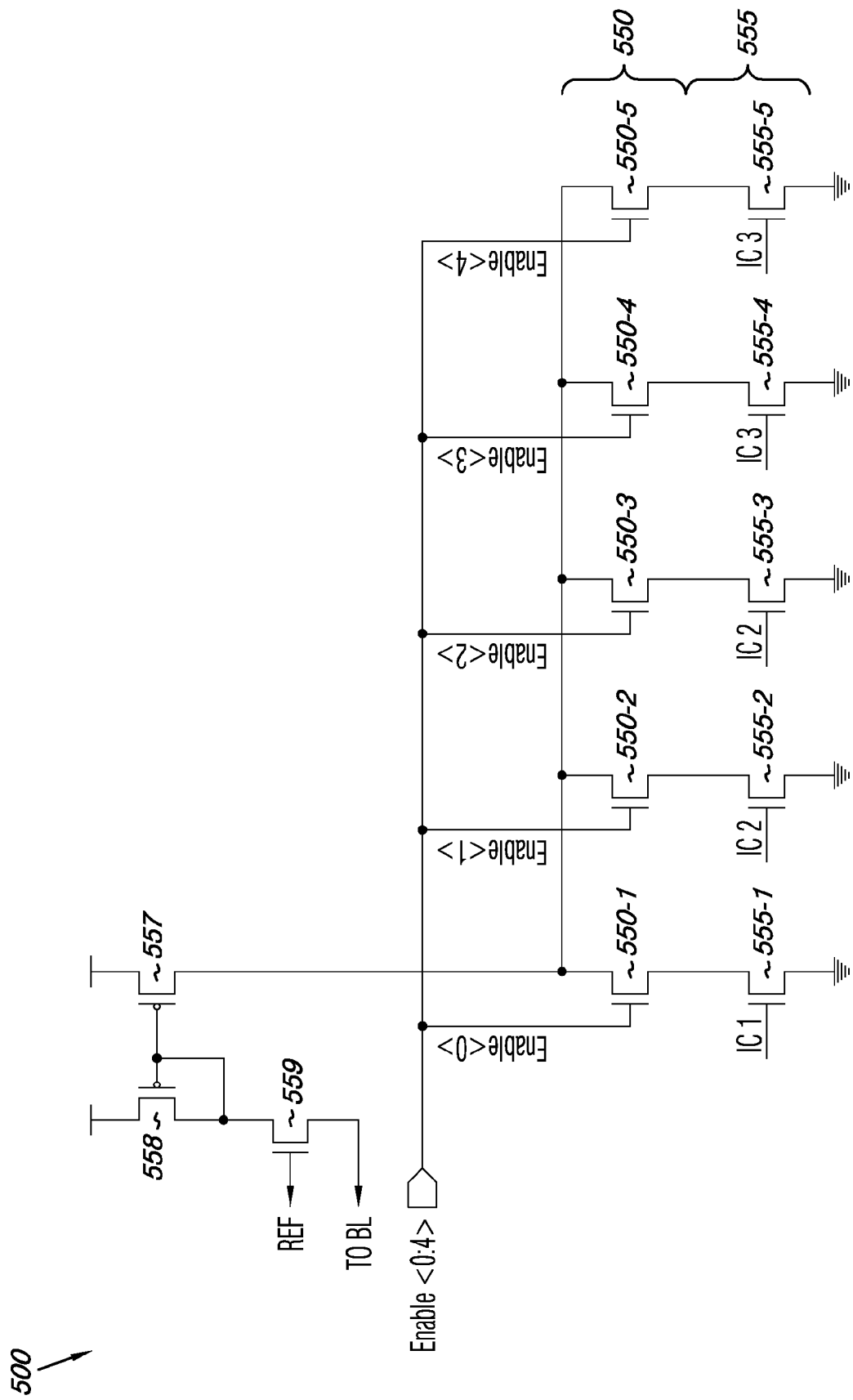
FIG. 5A illustrates circuitry for generating one or more reference currents in accordance with one or more embodiments of the present disclosure.

FIG. 5A illustrates circuitry 500 for generating one or more reference currents, e.g., program reference currents and/or read reference currents, in accordance with one or more embodiments of the present disclosure. In one or more embodiments, circuitry 500 can be associated with sense circuitry, such as one or more sense amplifiers, e.g., sense amplifiers 445-1, 445-2, 445-3, 445-4, 445-5, 445-6, 445-7, and 445-8 shown in FIG. 4.

Circuitry 500 includes NMOS transistors 550-1, 550-2, 550-3, 550-4, and 550-5, which form transistor set 550, and NMOS transistors 555-1, 555-2, 555-3, 555-4, and 555-5, which form transistor set 555. Transistor 555-1 is coupled to transistor 550-1, transistor 555-2 is coupled to transistor 550-2, transistor 555-3 is coupled to transistor 550-3, transistor 555-4 is coupled to transistor 550-4, and transistor 555-5 is coupled to transistor 550-5. Circuitry 500 also includes PMOS mirror transistors 557 and 558. Mirror transistor 557 is coupled to the output of each transistor in transistor set 550, and mirror transistor 558 is coupled to the gate of mirror transistor 557. Circuitry 500 also includes NMOS reference transistor 559, which is coupled to mirror transistors 557 and 558. Reference transistor 559 can provide a reference voltage and/or reference current which can be used in a sensing operation in accordance with one or more embodiments of the present disclosure. Reference transistor 559 can also be coupled to one or more data lines, e.g., bit lines 107-0, 107-1, . . . , 107-M shown in FIG. 1.

A number of initial currents, e.g., initial currents IC 1, IC 2, and IC 3 provided by initial current providers 440, 441, and 442 shown in FIG. 4, respectively, can be coupled to the gate of the transistors of transistor set 555. In the embodiment shown in FIG. 5A, IC 1 is coupled to the gate of transistor 555-1, IC 2 is coupled to the gate of transistors 555-2 and 555-3, and IC 3 is coupled to the gate of transistors 555-4 and 555-5. In the embodiment shown in FIG. 5A, IC 2 and IC 3 have been mirrored. Current mirroring will be described further herein.

A number of logic signals, e.g., Enable <0>, Enable <1>, Enable <2>, Enable <3>, and Enable <4>, can be applied to the gate of the transistors in transistor set 550. In the embodiment shown in FIG. 5A, Enable <0> is applied to the gate of transistor 550-1, Enable <1> is applied to the gate of transistor 550-2, Enable <2> is applied to the gate of transistor 550-3, Enable <3> is applied to the gate of transistor 550-4, and Enable <4> is applied to the gate of transistor 550-5. The logic signals can be used to selectively turn on the transistors in transistor set 550, as will be understood by one of skill in the art. For example, Enable <0> can be used to selectively turn on transistor 550-1, Enable <1> can be used to selectively turn on transistor 550-2, Enable <2> can be used to selectively turn on transistor 550-3, Enable <3> can be used to selectively turn on transistor 550-4, and Enable <4> can be used to selectively turn on transistor 550-5. The logic signals can be generated by a state machine (not shown), as will be appreciated by one of skill in the art.

When a transistor in transistor set 550 is turned on, the initial current applied to the transistor in transistor set 555 which is coupled to the turned-on transistor can be output from the turned-on transistor. This output initial current can be used as a reference current, e.g., a program reference current and/or a read reference current, which can be compared to a current applied to one or more word lines and/or bit lines via mirror transistors 557 and 558 and/or reference transistor 559 as part of a sensing operation of a memory cell, in accordance with one or more embodiments of the present disclosure. However, when a transistor in transistor set 550 is turned off, the initial current applied to the corresponding transistor in transistor set 555 will not be output from the transistor. For example, if transistor 550-1 is turned on, IC 1 can be output from transistor 550-1 and can be compared to a current applied to one or more word lines and/or bit lines via mirror transistors 557 and 558 and/or reference transistor 559 as part of a sensing operation of a memory cell, in accordance with one or more embodiments of the present disclosure. However, if transistor 550-1 is turned off, IC 1 will not be output from transistor 550-1.

Similarly, when multiple transistors in transistor set 550 are turned on, the initial currents applied to the transistors in transistor set 555 which are coupled to the turned-on transistors can be output from the turned-on transistors. These initial currents can then be summed to generate a reference current, e.g., a program reference current and/or a read reference current, which can be compared to a current applied to one or more word lines and/or bit lines via mirror transistors 557 and 558 and/or reference transistor 559 as part of a sensing operation of a memory cell, in accordance with one or more embodiments of the present disclosure. For example, if transistors 550-1 and 550-2 are turned on, IC 1 and IC 2 can be output from transistors 550-1 and 550-2, respectively, can be summed, and can be compared to a current applied to one or more word lines and/or bit lines via mirror transistors 557 and 558 and/or reference transistor 559 as part of a sensing operation of a memory cell, in accordance with one or more embodiments of the present disclosure.

In such a manner, circuitry 500 can generate a number of reference currents, e.g., a number of program reference currents and/or read reference currents, for use in a sensing operation of a memory cell by summing particular combinations of initial currents, in accordance with one or more embodiments of the present disclosure. For example, with reference to FIG. 3, circuitry 500 can generate Read Ref 1 by using logic signal Enable <0> to selectively turn on transistor 550-1, circuitry 500 can generate Program Ref 1 by using logic signals Enable <0> and Enable <1> to selectively turn on transistors 550-1 and 550-2, respectively, circuitry 500 can generate Read Ref 2 by using logic signals Enable <0>, Enable <1>, and Enable <2> to selectively turn on transistors 550-1, 550-2, and 550-3, respectively, circuitry 500 can generate Program Ref 2 by using logic signals Enable <0>, Enable <1>, Enable <2>, and Enable <3> to selectively turn on transistors 550-1, 550-2, 550-3, and 550-4, respectively, and circuitry 500 can generate Read Ref 3 by using logic signals Enable <0>, Enable <1>, Enable <2>, Enable <3>, and Enable <4> to selectively turn on transistors 550-1, 550-2, 550-3, 550-4, and 550-5, respectively. However, embodiments of the present disclosure are not so limited, and circuitry 500 can include different numbers of combinations of transistors, initial currents, and/or logic signals in order to generate different numbers of program reference currents and/or read reference currents. Such program reference currents and/or read reference currents can be generated by summing different combinations of initial currents, as will be appreciated by one of skill in the art.

Figure 5B:
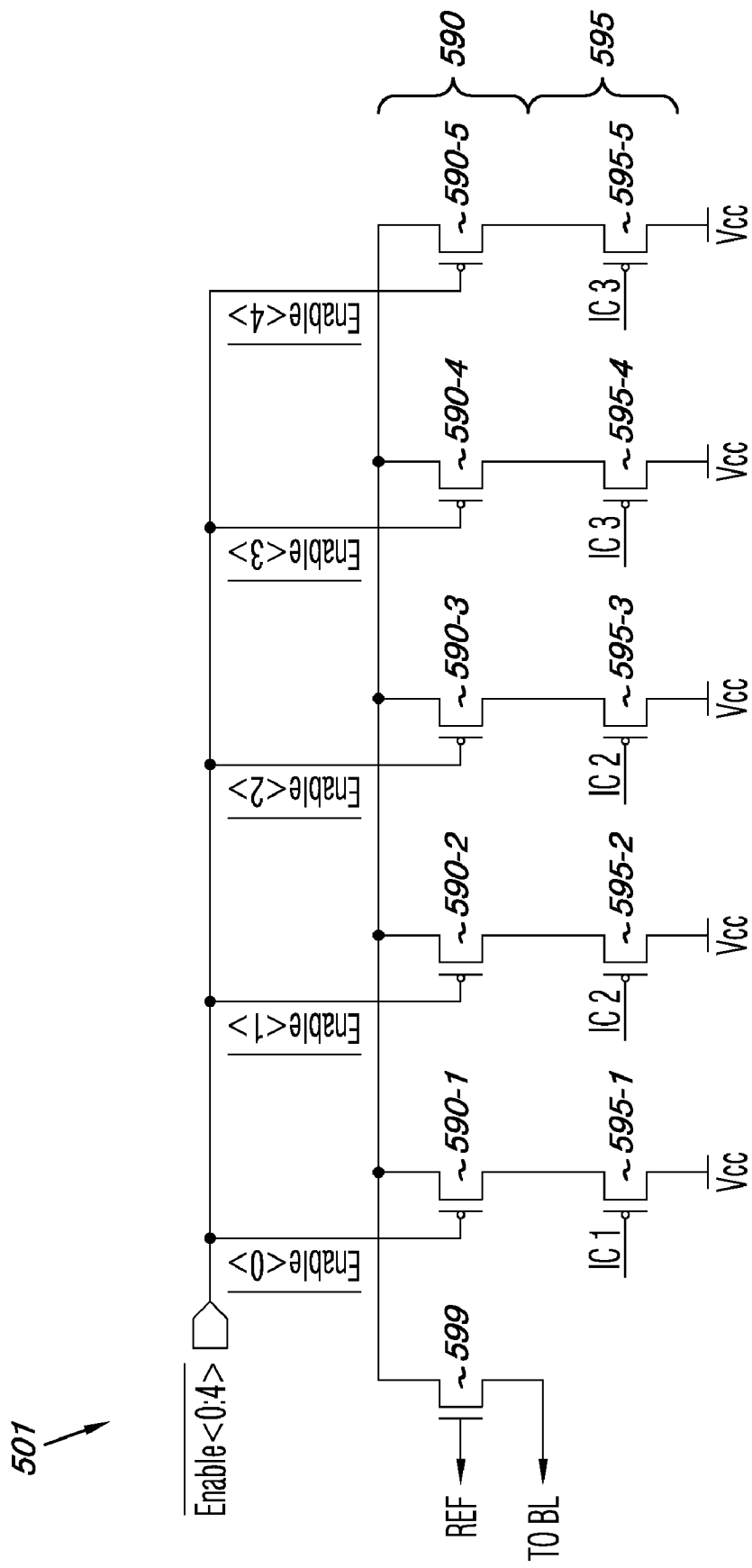
FIG. 5B illustrates circuitry for generating one or more reference currents in accordance with one or more embodiments of the present disclosure.

FIG. 5B illustrates circuitry 501 for generating one or more reference currents, e.g., program reference currents and/or read reference currents, in accordance with one or more embodiments of the present disclosure. In one or more embodiments, circuitry 501 can be used as an alternative to circuitry 500. In one or more embodiments, circuitry 501 can be associated with sense circuitry, such as one or more sense amplifiers, e.g., sense amplifiers 445-1, 445-2, 445-3, 445-4, 445-5, 445-6, 445-7, and 445-8 shown in FIG. 4.

Circuitry 501 is analogous to circuitry 500 shown in FIG. 5A, except that transistor set 550, which includes NMOS transistors 550-1, 550-2, 550-3, 550-4, and 550-5, is replaced by transistor set 590, which includes PMOS transistors 590-1, 590-2, 590-3, 590-4, and 590-5. Also, transistor set 555, which includes NMOS transistors 555-1, 555-2, 555-3, 555-4, and 555-5, each of which are coupled to ground, is replaced by transistor set 595, which includes PMOS transistors 595-1, 595-2, 595-3, 595-4, and 595-5, each of which are coupled to a power supply voltage, e.g., Vcc. However, embodiments are not limited to power supply voltage Vcc, and can include other power supply voltages, as will be understood by one of ordinary skill in the art. Further, mirror transistors 557 and 558 are not included, and reference transistor 599 is coupled to the output of each transistor in transistor set 590.

A number of initial currents, e.g., initial currents IC 1, IC 2, and IC 3 provided by initial current providers 440, 441, and 442 shown in FIG. 4, respectively, can be coupled to the gate of the transistors of transistor set 595. In the embodiment shown in FIG. 5B, the initial currents are coupled to the gate of the transistors of transistor set 595 in a manner which is analogous to the manner in which the initial currents are coupled to the gate of the transistors of transistor set 555 shown in FIG. 5A.

A number of logic signals, e.g., $\overline{\text{Enable}}$ <0>, $\overline{\text{Enable}}$ <1>, $\overline{\text{Enable}}$ <2>, $\overline{\text{Enable}}$ <3>, and $\overline{\text{Enable}}$ <4>, can be applied to the gate of the transistors in transistor set 590. In the embodiment shown in FIG. 5B, the logic signals are applied to the gate of the transistors in transistor set 590 in a manner which is analogous to the manner in which the logic signals are applied to the gate of the transistors in transistor set 550 shown in FIG. 5A. The logic signals can be used to selectively turn on the transistors in transistor set 590 in a manner which is analogous to the manner in which the logic signals can be used to selectively turn on the transistors in transistor set 550 shown in FIG. 5A. The logic signals can be generated by a state machine (not shown), as will be appreciated by one of skill in the art.

When a transistor in transistor set 590 is turned on, the initial current applied to the transistor in transistor set 595 which is coupled to the turned-on transistor can be output from the turned-on transistor. This output initial current can be used as a reference current, e.g., a program reference current and/or a read reference current, which can be compared to a current applied to one or more word lines and/or bit lines via reference transistor 599 as part of a sensing operation of a memory cell, in accordance with one or more embodiments of the present disclosure. However, when a transistor in transistor set 550 is turned off, the initial current applied to the corresponding transistor in transistor set 595 will not be output from the transistor.

Similarly, when multiple transistors in transistor set 590 are turned on, the initial currents applied to the transistors in transistor set 595 which are coupled to the turned-on transistors can be output from the turned-on transistors. These initial currents can then be summed to generate a reference current, e.g., a program reference current and/or a read reference current, which can be compared to a current applied to one or more word lines and/or bit lines via reference transistor 599 as part of a sensing operation of a memory cell, in accordance with one or more embodiments of the present disclosure.

In such a manner, circuitry 501 can generate a number of reference currents, e.g., a number of program reference currents and/or read reference currents, for use in a sensing operation of a memory cell by summing particular combinations of initial currents, in accordance with one or more embodiments of the present disclosure. For example, with reference to FIG. 3, circuitry 501 can generate Read Ref 1, Program Ref 1, Read Ref 2, Program Ref 2, and Read Ref 3 in a manner analogous to that previously described in connection with FIG. 5A. However, embodiments of the present disclosure are not so limited, and circuitry 500 can include different numbers of combinations of transistors, initial currents, and/or logic signals in order to generate different numbers of program reference currents and/or read reference currents. Such program reference currents and/or read reference currents can be generated by summing different combinations of initial currents, as will be appreciated by one of skill in the art.

Embodiments of the present disclosure are not limited to circuitry 500 shown in FIG. 5A and/or circuitry 501 shown in FIG. 5B, and can include other circuitry for generating one or more reference currents for use in a sensing operation in accordance with one or more embodiments of the present disclosure.

Figure 6:
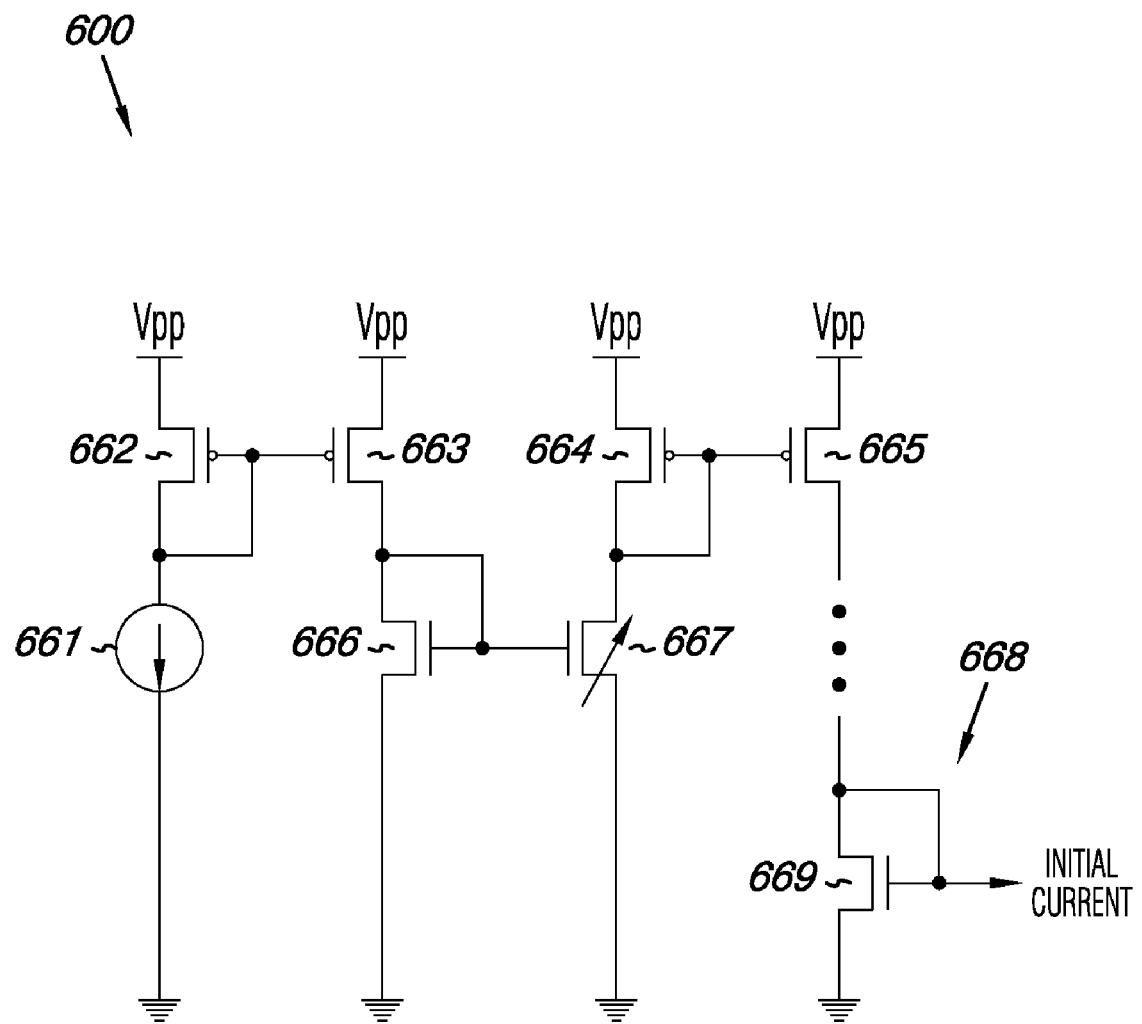
FIG. 6 illustrates circuitry for providing one or more initial currents in accordance with one or more embodiments of the present disclosure.

FIG. 6 illustrates circuitry 600 for providing one or more initial currents in accordance with one or more embodiments of the present disclosure. In one or more embodiments, circuitry 600 can be associated with one or more initial current providers, e.g., initial current providers 440, 441, and 442 shown in FIG. 4. In one or more embodiments, circuitry 600 can provide one or more temperature compensated initial currents, as will be further described herein.

Circuitry 600 includes DC bandgap current 661. DC bandgap current 661 can be generated by bandgap circuitry (not shown), as will be appreciated by one of skill in the art. Circuitry 600 also includes PMOS transistors 662, 663, 664, and 665, NMOS transistor 666, and variable width NMOS transistor 667. As transistor 667 has a variable width, transistor 666 and transistor 667 can have an adjustable width ratio. Circuitry 600 also includes receiver circuit 668, which includes NMOS transistor 669.

As shown in FIG. 6, the gate of transistor 662 is coupled to the gate of transistor 663, the gate of transistor 664 is coupled to the gate of transistor 665, and the gate of transistor 666 is coupled to the gate of variable width transistor 667. Also, DC bandgap current 661 is coupled to transistors 662 and 663, transistor 663 is coupled to transistor 666 and variable width transistor 667, and variable width transistor 667 is coupled to transistors 664 and 665. Additionally, transistors 662, 663, 664, and 665 can be coupled to a power supply voltage. In the embodiment illustrated in FIG. 6, transistors 662, 663, 664, and 665 are coupled to power supply voltage Vpp. However, embodiments are not so limited, and can include other power supply voltages, as will be understood by one or ordinary skill in the art. Also, receiver circuit 668 is coupled to the output of transistor 665. In one or more embodiments, receiver circuit 668 can be located near a sense amplifier, e.g., sense amplifiers 445-1, 445-2, 445-3, 445-4, 445-5, 445-6, 445-7, and/or 445-8 shown in FIG. 4, in order to minimize the effects of ground noise that can occur when the initial current is mirrored. In one or more embodiments, DC bandgap current 661, transistors 662, 663, 664, 665, and 666, and variable width transistor 667, receiver circuit 668, and power supply voltage Vpp can be used to provide one or more initial currents, e.g., IC 1, IC 2, and IC 3, for use in sensing a memory cell, in accordance with one or more embodiments of the present disclosure.

As described above, in one or more embodiments of the present disclosure, the reference currents, e.g., the program reference currents and/or read reference currents, can be temperature compensated to reflect the temperature dependence of the current output from a phase change memory cell during a sensing operation of the memory cell. In one or more embodiments, temperature compensation of the reference currents can be achieved by adjusting the initial currents that can be summed to generate the reference currents in response to a change in temperature. Compensating the one or more initial currents provided by circuitry 600 for a change in temperature can result in an analogous temperature compensation of the reference currents, because the reference currents can be generated by summing the temperature compensated initial currents. In one or more embodiments, the temperature compensated initial currents and/or the temperature compensated reference currents can have unique temperature coefficients.

In one or more embodiments, circuitry 600 can include temperature compensation circuitry configured to compensate the one or more initial currents provided by circuitry 600 for the temperature dependence of the current output from a phase change memory cell during a sensing operation of the memory cell. Such temperature circuitry can be coupled to transistor 666 and/or adjustable width transistor 667, and will be further described herein.

In one or more embodiments, transistor 665 can be a variable width transistor, and transistor 667 is not a variable width transistor. In such embodiments, transistors 664 and 665 can have an adjustable width ratio, while transistors 666 and 667 will not have an adjustable width ratio, as transistor 665, and not transistor 667, has a variable width. In such embodiments, the temperature compensation circuitry described herein can be coupled to transistor 664 and/or adjustable width transistor 665, instead of to transistor 666 and/or 667.

Embodiments of the present disclosure are not limited to circuitry 600, and can include other circuitry for providing one or more temperature compensated initial currents for use in a sensing operation. Further, embodiments of the present disclosure are not limited to the temperature compensation circuitry and/or temperature compensation methods described herein, and can include other temperature compensation circuitry and/or temperature compensation methods.

Figure 7:
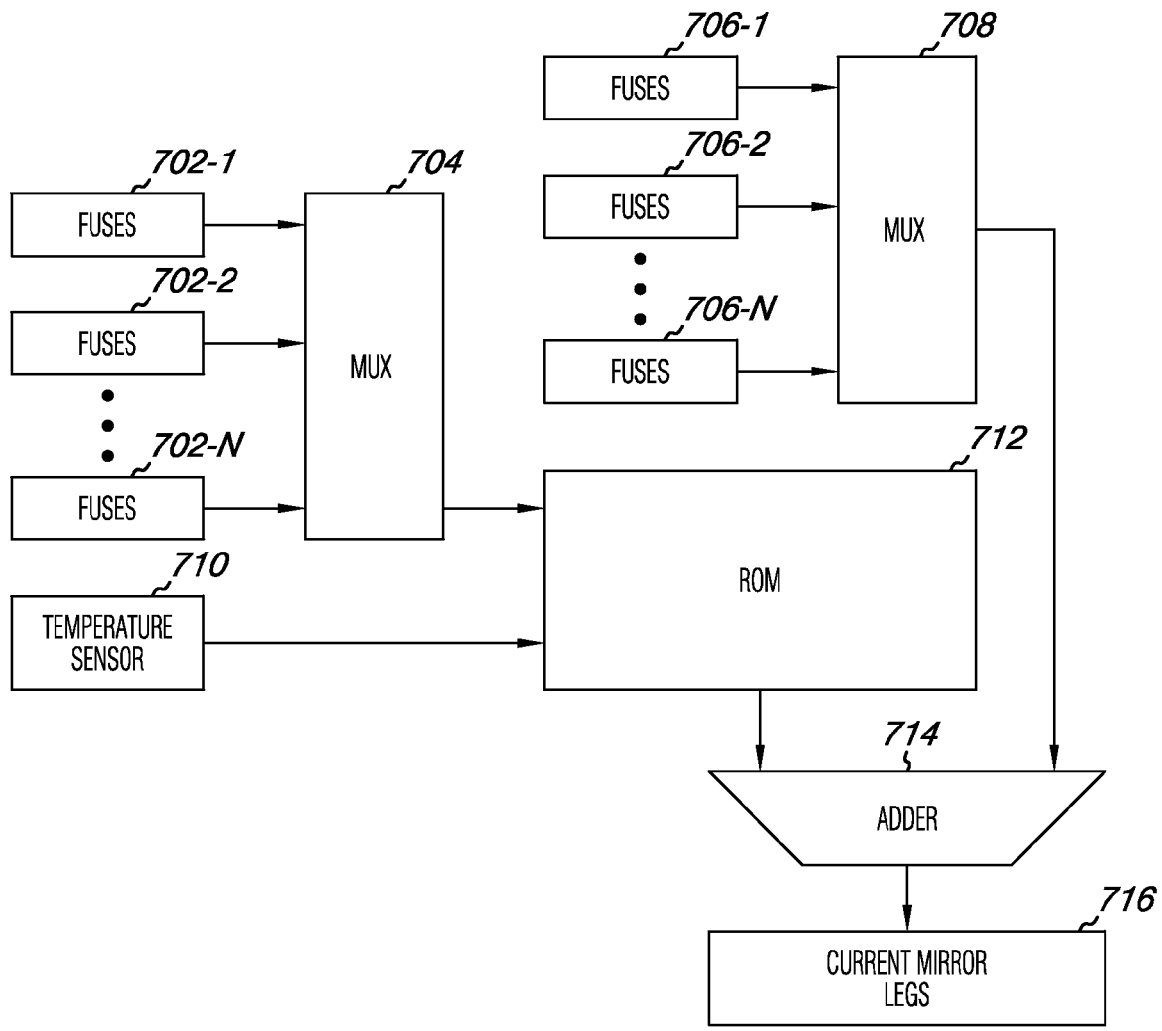
FIG. 7 is a block diagram of temperature compensation circuitry in accordance with one or more embodiments of the present disclosure.

FIG. 7 is a block diagram of temperature compensation circuitry in accordance with one or more embodiments of the present disclosure. In one or more embodiments, the temperature compensation circuitry shown in FIG. 7 can be coupled to circuitry 600 shown in FIG. 6 to provide one or more temperature compensated initial currents, as previously described herein.

The temperature compensation circuitry shown in FIG. 7 includes a first group of sets of fuses, e.g., sets 706-1, 706-2, ..., 706-N. A set of fuses can include a number of fuses. As used herein, "fuses" can include fuses and/or antifuses, among other types of conductive path controlling devices. Each set of fuses in the first group can be programmed to represent a magnitude of a corresponding initial current at a certain operating temperature, such as a specified lowest or highest operating temperature of the memory device in which the temperature compensation circuitry is located, among other temperatures. Accordingly, different sets of fuses, e.g., sets 706-1 and 706-2, can be programmed to represent different magnitudes of different initial currents at either the specified lowest operating temperature of the memory device or the specified highest operating temperature. That is, different sets of fuses can correspond to different initial currents.

As shown in FIG. 7, the first group of sets of fuses are coupled to multiplexor 708. Multiplexor 708 can select the particular set of fuses that corresponds to a particular one of the initial currents and output a signal(s) corresponding to the particular set of programmed fuses to an adder or subtractor 714 (depending on whether the selected fuses are programmed to correspond to the magnitude of the selected initial current at the lowest or highest specified operating temperature, respectively). Operation of an embodiment where the selected fuses are programmed to correspond to the magnitude of the selected initial current at the lowest specified operating temperature and wherein 714 is an adder 714 will be further described herein.

The temperature compensation circuitry shown in FIG. 7 also includes a second group of sets of fuses, e.g., sets 702-1, 702-2, ..., 702-N. Each set of fuses in the second group can store data corresponding to a difference in magnitude of a corresponding initial current between a highest specified operating temperature and a lowest specified operating temperature of the memory device.

As shown in FIG. 7, the second group of sets of fuses are coupled to multiplexor 704. Multiplexor 704 can select the particular set of fuses that corresponds to a particular initial current and output a signal(s) corresponding to the particular set of fuses to a look-up table stored in memory, such as read only memory (ROM) 712. Operation of ROM 712 is further described herein.

As used herein, a "highest" and "lowest" operating temperature of a memory device can be specified by, for example, the manufacturer of the memory device. For example, a manufacturer could specify that the memory device is designed to operate between −40 degrees Celsius and 120 degrees Celsius, e.g., to correspond to a product specification. The magnitudes of different initial currents at the specified highest and lowest temperatures for the memory device can be determined experimentally for a particular device, among other means.

Such magnitudes can be coded and programmed into fuses. That is, a particular set of fuses can be programmed to represent the endpoints of a plot of a particular determined temperature compensated initial current versus operating temperature. For certain memory devices, it may be appropriate to use fuses that are substantially similar to the memory cells of the device. However, for memory devices that may include temperature sensitive memory cells, such as PCRAM devices, it may be appropriate to utilize fuses other than the type of memory cells in the device. For embodiments including PCRAM memory cells, it may be beneficial to use laser, gate oxide, or other fuse types to help provide a greater degree of temperature immunity to the fuses so that, for example, the data stored in the fuses is less likely to be corrupted when the memory device is soldered.

The temperature compensation circuitry shown in FIG. 7 also includes temperature sensor 710. Temperature sensor 710 can send an output signal(s) to ROM 712 that corresponds to the operating temperature of the memory device.

In one or more embodiments, the look-up table, e.g., ROM table 712, can include data corresponding to desired changes in various initial currents at various operating temperatures. Accordingly, the data stored in ROM 712 can correspond to a plot of one or more initial currents versus temperature over the specified operating range of the memory device.

As described herein, the magnitude of the initial current at the highest and lowest operating temperatures, e.g., the endpoints of a plot of the initial current versus operating temperature, can be determined experimentally. The magnitude of the initial current at temperatures between the highest and lowest operating temperatures can be interpolated based on a function. Values corresponding to that function, valid across a number of initial currents that correspond to that function, can be stored in ROM 712.

For example, an initial current can change linearly with respect to operating temperature. Accordingly, the interpolated value of an initial current for a particular temperature can be equal to A, the difference in current magnitudes at the highest and lowest operating temperatures (e.g., the output of multiplexor 704), divided by B, the difference between the highest and lowest operating temperatures, multiplied by C, the particular temperature (e.g., the output of temperature sensor 710), plus the magnitude of the current at the lowest operating temperature (e.g., the output of multiplexor 708). Data corresponding to such a function can be stored in ROM 712.

As one of ordinary skill in the art will appreciate, not all initial currents will change linearly with respect to operating temperature. Accordingly, embodiments of the present disclosure can be modified by one of ordinary skill in the art to populate a ROM with appropriate data for the behavior of a given initial current. For example, some initial currents may change logarithmically with respect to operating temperature.

In one or more embodiments, ROM table 712 can be populated with data that can be selected by a decoder (not shown) that can receive a signal(s) from multiplexor 704, such as those corresponding to a 10-digit binary number, that represents a difference in magnitude between the initial current at the highest specified operating temperature for the memory device and the current at the lowest operating temperature for the memory device to select the appropriate row(s) of ROM table 712. Another decoder (not shown) can also receive a signal(s) from temperature sensor 710, such as those corresponding to a 7-digit binary number, that represents the sensed operating temperature of the memory device and selects the appropriate columns of ROM table 712. ROM table 712 can output a signal(s) corresponding to a 10-digit binary number to adder 714.

The ROM table 712 output can be sent to adder 714 along with the output of multiplexor 708, a signal(s) corresponding to a 10-digit binary number that represents a magnitude of the initial current at the lowest specified operating temperature. Adder 714 can output a signal(s) corresponding to a 10-digit binary number (e.g., 10 signals, InCur<9:0> shown in FIG. 9) corresponding to an interpolated magnitude of the initial current at the sensed operating temperature of the memory device. The output of adder 714 can be sent to current mirror legs 716, and can indicate that current mirror leg 716 needs to multiply the initial current by a particular multiple due to the particular sensed operating temperature, e.g., that current mirror leg 716 needs to compensate the initial current due to the particular sensed operating temperature. For example, the output of adder 714 can be mirrored with a bandgap current, e.g., DC bandgap current 661 shown in FIG. 6, to produce a temperature compensated initial current that can be used in sensing operations in accordance with the present disclosure.

As used herein, "mirroring" an initial current refers to a process in which that same initial current is provided to multiple locations of a memory device. That is, mirroring an initial current by a multiple can result in that same initial current being provided to a number of locations of the memory device that is equal to the multiple. For example, in the embodiment illustrated in FIG. 5A, IC 2 and IC 3 have each been mirrored by a multiple of two, such that IC 2 and IC 3 are provided to two locations of circuitry 500, e.g., IC 2 is provided to transistors 555-2 and 555-3, and IC 3 is provided to transistors 555-4 and 555-5.

Embodiments are not limited to the particular implementations described herein. For example, the resolution of the ROM can be increased or decreased to suit the parameters of a particular implementation, and accordingly, input signals corresponding to greater or fewer than 7-digit or 10-digit binary numbers can be used. Furthermore, embodiments of the present disclosure are not limited to implementations using binary numbers or a particular amount of data associated with various signals.

Figure 8:
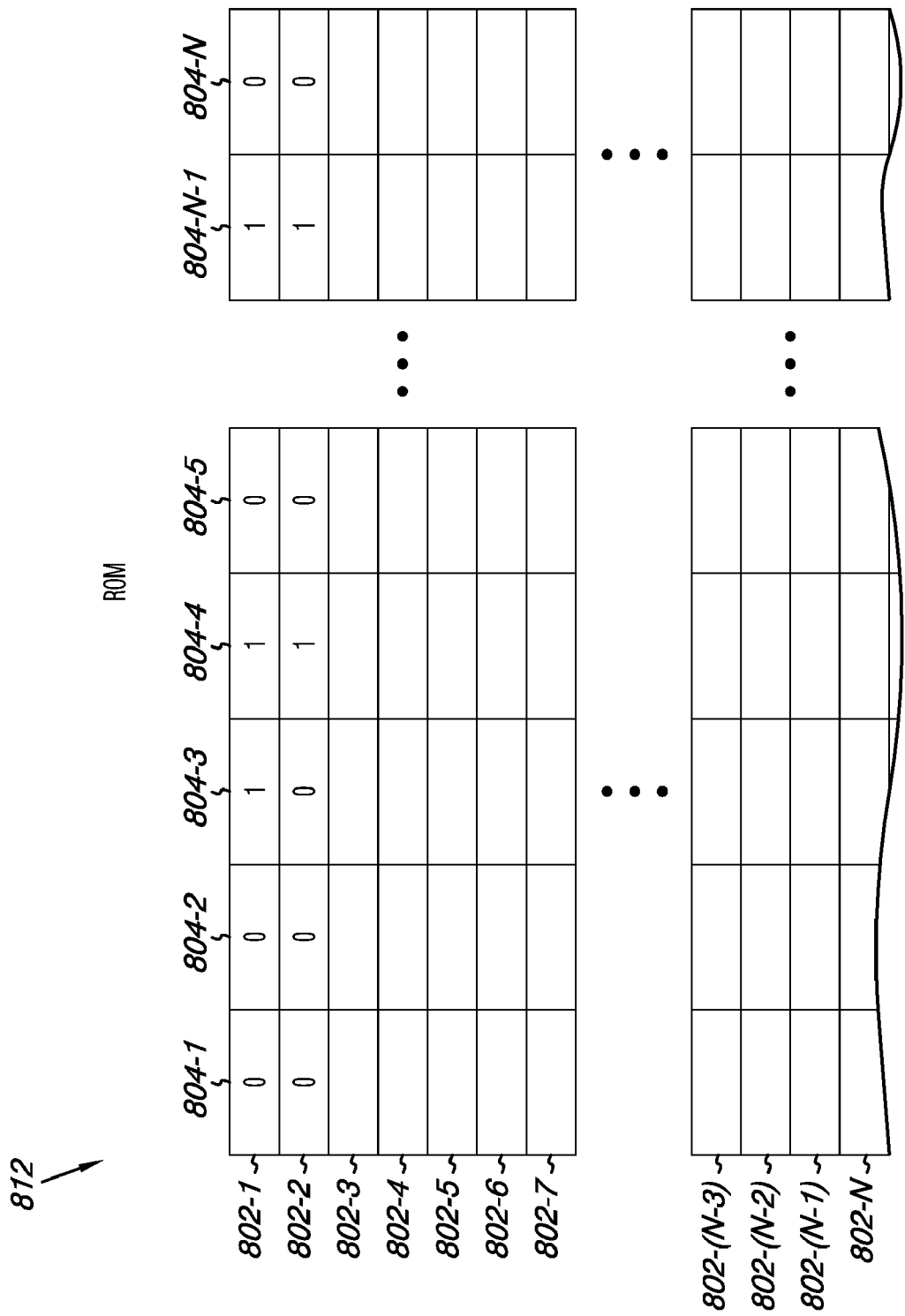
FIG. 8 is a look-up table of data corresponding to desired changes in initial currents in response to temperature in accordance with one or more embodiments of the present disclosure.

FIG. 8 is a look-up table, e.g., ROM 812, of data corresponding to desired changes in initial currents in response to temperature in accordance with one or more embodiments of the present disclosure. As shown in FIG. 8, ROM 812 includes columns 804-1, 804-2, 804-3, 804-4, 804-5, ..., 804-N–1, and 804-N. The columns in ROM 812 can correspond to the temperature of the memory device. ROM 812 can receive a signal(s) corresponding to a 7-digit binary number from a temperature sensor, e.g., temperature sensor 710 shown in FIG. 7, corresponding to the operating temperature of the memory device. The signal can be decoded and the columns associated with the device's temperature can be selected in ROM 812. In one or more embodiments, ROM 812 can have 810 columns. The columns can correspond to 81 temperatures that occur in 2 degree Celsius (° C.) increments in a memory device operating range of −40° C. to 120° C., and for each temperature increment there are 10 columns that correlate to the 10-digit binary number corresponding to a desired change in an initial current.

As shown in FIG. 8, ROM 812 also includes rows 802-1, 802-2, 802-3, 802-4, 802-5, 802-6, 802-7, 802-N-3, 802-N-2, ..., 802-N-1, and 802-N. ROM 812 can receive a signal(s) corresponding to a 10-digit number from a multiplexor, e.g., multiplexor 704 shown in FIG. 7, that corresponds to a difference in initial current magnitudes at a certain high and a certain low specified operating temperatures. The signal(s) is decoded and the rows associated with the difference are selected in ROM 812. ROM 812 generates a signal(s) corresponding to a multiple, e.g., a 10-digit binary number, from its look-up table corresponding to a difference in initial current magnitudes at the certain high and low specified operating temperatures. In one or more embodiments, ROM 812 can have 1024 rows. The rows 802-1, 802-2, ... 802-N can correspond to a number of 10-digit binary number combinations that are associated with the difference input to ROM 812.

In one or more embodiments, ROM 812 can be implemented as a single transistor pulldown with a metal or contact programmable data value. In one or more embodiments, a single bit of ROM 812 can be approximately 0.16 µm$^2$, therefore an embodiment with 810 columns and 1024 rows would have a footprint of 1.32×10$^5$ µm$^2$. For certain memory devices, this footprint may constitute less than 8% of the available space in the periphery of the device.

ROM 812 can be placed in an area on a side of a die. ROM 812 can also be physically segmented to allow for portions of ROM 812 to be placed in various areas of the die. ROM 812 can operate without DC currents and can also be read whenever the temperature sensor changes its output.

In two-bit multi-level cells, three initial currents can be used in sensing operations in accordance with one or more embodiments of the present disclosure. Hence, three fuses corresponding to the three initial currents can be coupled to ROM 312. However, embodiments are not so limited, and can include any number of fuses corresponding to any number of initial currents. Also, ROM 312 can output a temperature dependent change in initial current in a linear or non-linear curve fit, as previously described herein.

Figure 9:
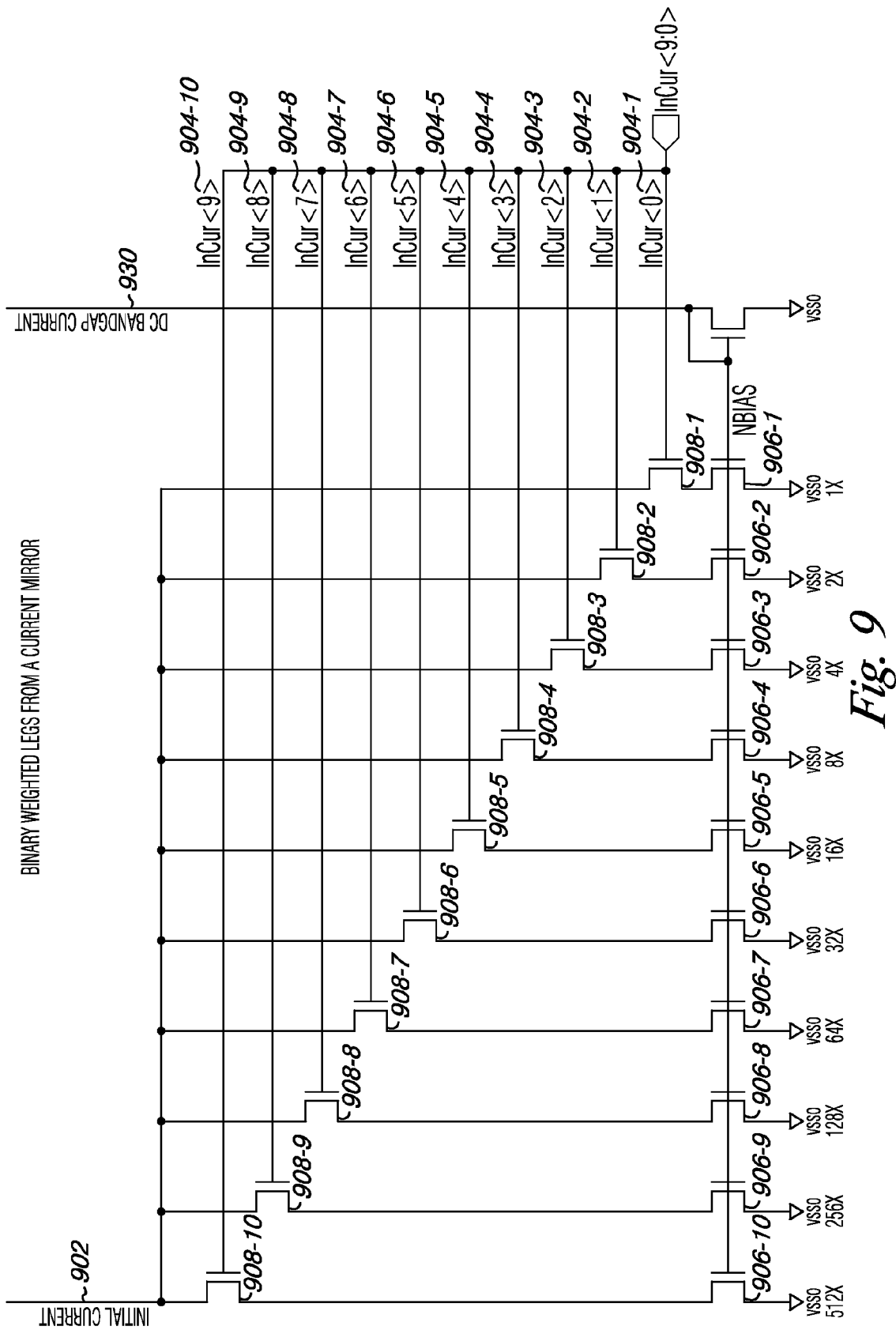
FIG. 9 illustrates temperature compensation circuitry in accordance with one or more embodiments of the present disclosure.

FIG. 9 illustrates temperature compensation circuitry in accordance with one or more embodiments of the present disclosure. In one or more embodiments, the temperature compensation circuitry shown in FIG. 9 can be coupled to circuitry 600 shown in FIG. 6 to provide one or more temperature compensated initial currents, as previously described herein. In one or more embodiments, the temperature compensation circuitry shown in FIG. 9 can be used in conjunction with the temperature compensation circuitry shown in FIG. 7.

As shown in FIG. 9, DC bandgap current 930 is input to a series of mirroring transistors 906-1, 906-2, 906-3, 906-4, 906-5, 906-6, 906-7, 906-8, 906-9, and 906-10. The signal(s) (e.g., 10 signals, InCur<9:0>) corresponding to an interpolated magnitude of the selected desired initial current at the operating temperature is fed into the current mirror via the 10 inputs 904-1, 904-2, 904-3, 904-4, 904-5, 904-6, 904-7, 904-8, 904-9, and 904-10. These signals can open or close the gates on transistors 908-1, 908-2, 908-3, 908-4, 908-5, 908-6, 908-7, 908-8, 908-9, and 908-10. When a transistor 908-1, 908-2, 908-3, 908-4, 908-5, 908-6, 908-7, 908-8, 908-9, or 908-10 is turned on by a respective signal on an input 904-1, 904-2, 904-3, 904-4, 904-5, 904-6, 904-7, 904-8, 904-9, or 904-10, the DC bandgap current is mirrored by a multiple associated with the transistor. This can allow the DC bandgap current to be multiplied by the appropriate factor to compensate for temperature changes in the memory device. This temperature compensated initial current 902 is output from the current mirror and can be used in sensing operations in accordance with the present disclosure, as previously described herein.

In one or more embodiments, the output of the series of mirroring transistors can be coupled to transistor 666 and/or variable width transistor 667, and can adjust the adjustable width ratio associated with transistor 666 and variable width transistor 667, which can provide a range of temperature compensated initial currents that can be used in sensing operations in accordance with the present disclosure, as previously described herein.

Figure 10:
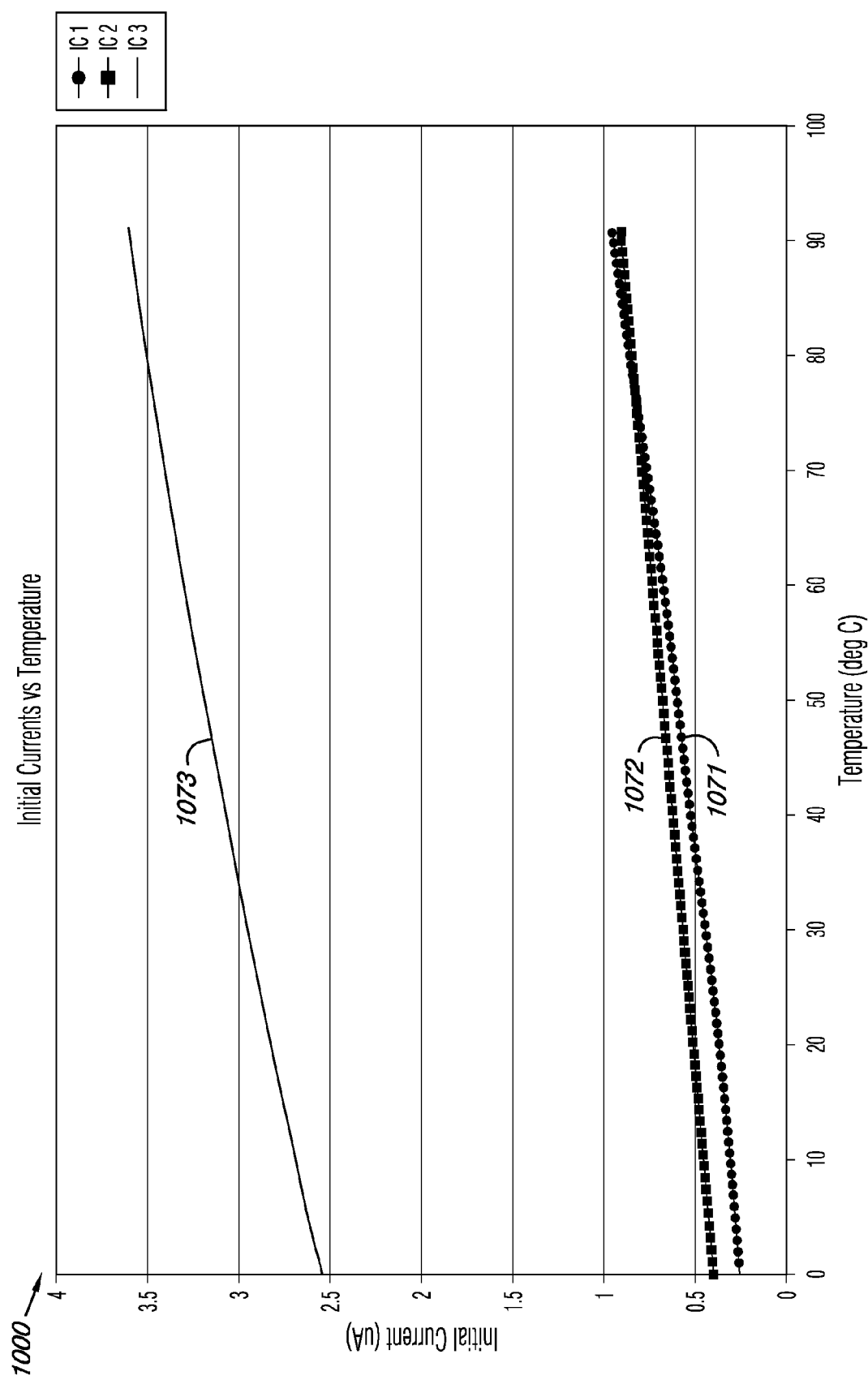
FIG. 10 is a graph of three temperature compensated initial currents versus temperature that can be provided in accordance with one or more embodiments of the present disclosure.

FIG. 10 is a graph 1000 of three temperature compensated initial currents 1071, 1072, and 1073 versus temperature that can be provided in accordance with one or more embodiments of the present disclosure. In one or more embodiments, the temperature compensated initial currents can be provided by circuitry 600, as previously described herein.

Initial currents 1071, 1072, and 1073 versus temperature, e.g., "initial current curves," were determined experimentally by applying a number of known currents to the phase change material of a phase change memory cell at a number of temperatures, and measuring the resulting currents associated with the memory cell, e.g., the current output from the memory cell, for each temperature. With reference to FIG. 3, in one or more embodiments initial current curve 1071 can correspond to IC 1, initial current curve 1072 can correspond to IC 2, and initial current curve 1073 can correspond to IC 3.

Each point on the initial current curves can represent a current value, e.g., magnitude, which can be used as a temperature compensated initial current in accordance with one or more embodiments of the present disclosure. That is, the current magnitudes illustrated by the initial current curves for a given temperature can represent the temperature compensated initial currents for that temperature. For example, as shown in FIG. 10, to achieve temperature compensation of the initial currents at a temperature of 30 degrees Celsius, IC 1 can be 0.4 uA, IC 2 can be 0.6 uA, and IC 3 can be 2.9 uA. Similarly, to achieve temperature compensation at a temperature of 60 degrees Celsius, IC 1 can be 0.7 uA, IC 2 can be 0.75 uA, and IC 3 can be 3.3 uA.

Embodiments of the present disclosure are not limited to the initial current curves shown in FIG. 10. Rather, embodiments of the present disclosure can include different numbers of initial current curves which can illustrate temperature compensated initial currents in accordance with one or more embodiments of the present disclosure.

Figure 11:
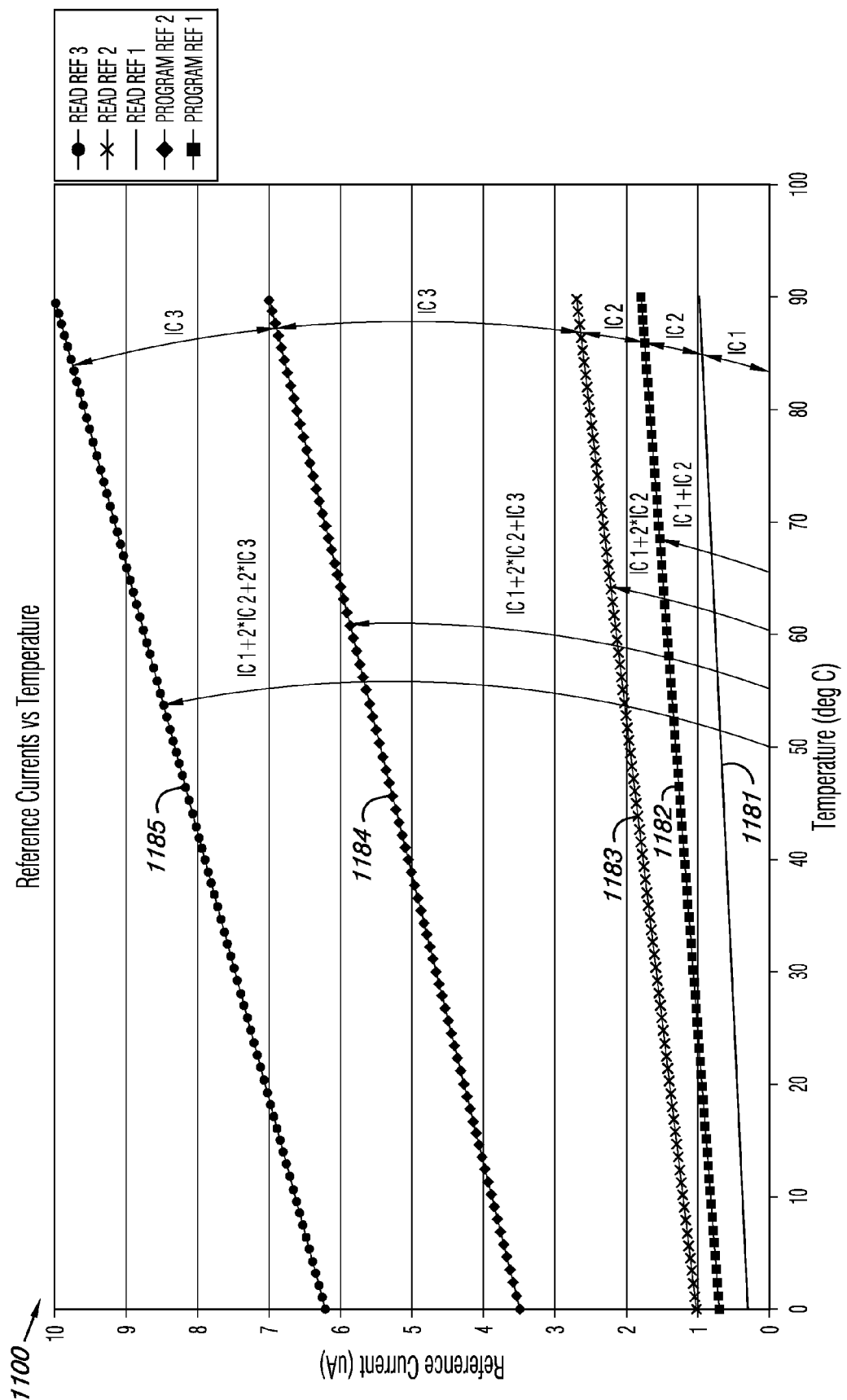
FIG. 11 is a graph of five temperature compensated reference currents versus temperature that can be generated using the temperature compensated initial currents illustrated in FIG. 7 in accordance with one or more embodiments of the present disclosure.

FIG. 11 is a graph 1100 of five temperature compensated reference currents 1181, 1182, 1183, 1184, and 1185 versus temperature that can be generated using the temperature compensated initial currents illustrated in FIG. 10 in accordance with one or more embodiments of the present disclosure. In one or more embodiments, the temperature compensated reference currents can be provided by circuitry 500 and/or circuitry 501, as previously described in connection with FIGS. 5A and 5B.

Reference currents 1181, 1182, 1183, 1184, and 1185 versus temperature, e.g., "reference current curves," were determined by summing particular combinations of initial current curves 1071, 1072, and 1073, e.g., IC 1, IC 2, and IC 3, shown in FIG. 10. For example, reference current curve 1181 was determined by using initial current curve 1071, reference current curve 1182 was determined by summing initial current curves 1071 and 1072, reference current curve 1183 was determined by summing initial current curve 1071 and twice initial current curve 1072, reference current curve 1184 was determined by summing initial current curve 1071, twice initial current curve 1072, and initial current curve 1073, and reference current curve 1185 was determined by summing initial current curve 1071, twice initial current curve 1072, and twice initial current curve 1073. With reference to FIG. 3, in one or more embodiments reference current curve 1181 can correspond to Read Ref 1, reference current curve 1182 can correspond to Program Ref 1, reference current curve 1183 can correspond to Read Ref 2, reference current curve 1184 can correspond to Program Ref 2, and reference current curve 1185 can correspond to Read Ref 3.

Each point on the reference current curves can represent a current value, e.g., magnitude, which can be used as a temperature compensated reference current in accordance with one or more embodiments of the present disclosure. That is, the current magnitudes illustrated by the reference current curves for a given temperature will represent the temperature compensated reference currents for that temperature. For example, as shown in FIG. 11, to achieve temperature compensation of the reference currents at a temperature of 30 degrees Celsius, Read Ref 1 can be 0.4 uA, Program Ref 1 can be 1.0 uA, Read Ref 2 can be 1.6 uA, Program Ref 2 can be 4.5 uA, and Read Ref 3 can be 7.4 uA. Similarly, to achieve temperature compensation at a temperature of 60 degrees Celsius, Read Ref 1 can be 0.7 uA, Program Ref 1 can be 1.5 uA, Read Ref 2 can be 2.2 uA, Program Ref 2 can be 5.5 uA, and Read Ref 3 can be 8.8 uA.

Embodiments of the present disclosure are not limited to the reference current curves shown in FIG. 11. Rather, embodiments of the present disclosure can include different numbers of reference currents, including different numbers of read reference current curves and/or program reference current curves, to reflect temperature compensated reference currents in accordance with one or more embodiments of the present disclosure.

Figure 12:
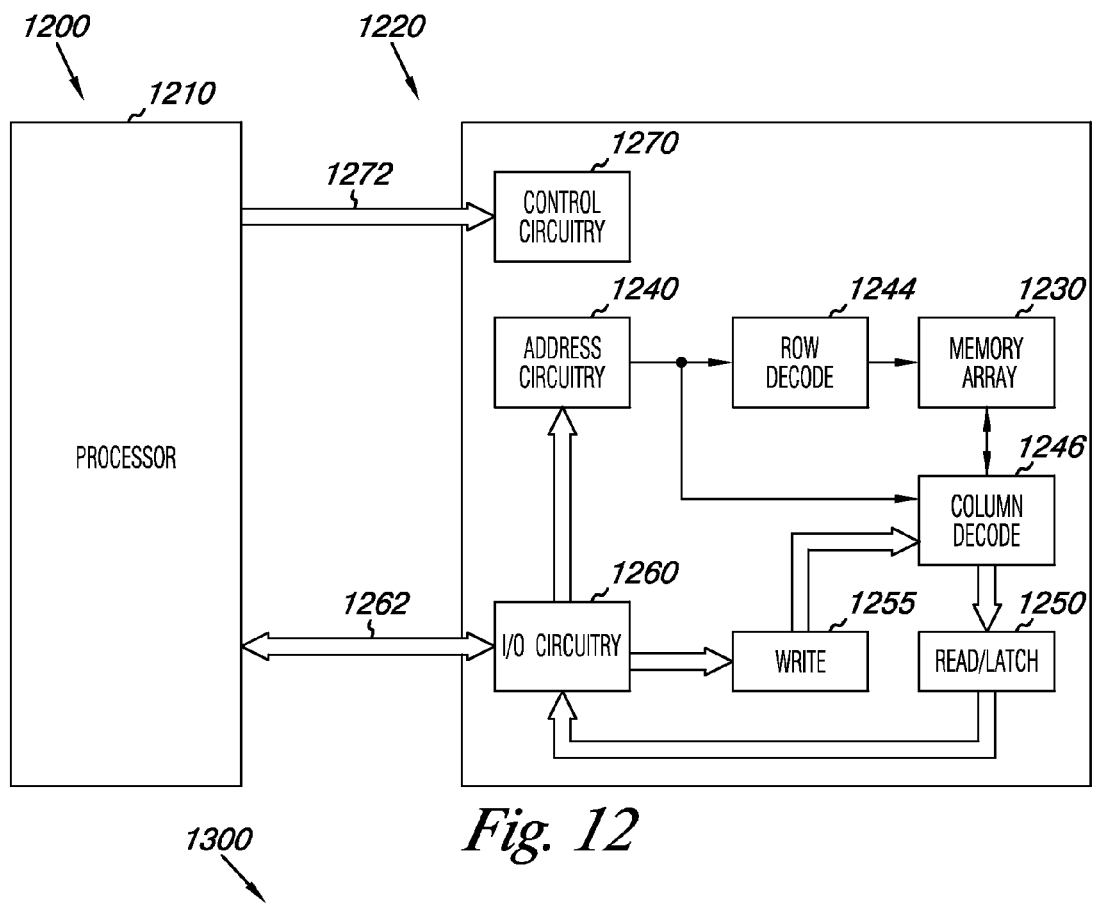
FIG. 12 is a functional block diagram of an electronic memory system having at least one memory device in accordance with one or more embodiments of the present disclosure.

FIG. 12 is a functional block diagram of an electronic memory system 1200 having at least one memory device 1220 in accordance with one or more embodiments of the present disclosure. Memory system 1200 can include a processor 1210 coupled to a memory device 1220 that can include a memory array 1230 of memory cells, e.g., memory array 100 shown in FIG. 1. The memory system 1200 can include separate integrated circuits or both the processor 1210 and the memory device 1220 can be on the same integrated circuit. The processor 1210 can be a microprocessor or some other type of controlling circuitry such as an application-specific integrated circuit (ASIC).

The memory device 1220 can include an array of memory cells 1230, which can be resistance variable memory cells with a PCRAM architecture, for example. The embodiment of FIG. 12 includes address circuitry 1240 to latch address signals provided over I/O connections 1262 through I/O circuitry 1260. Address signals can be received and decoded by a row decoder 1244 and a column decoder 1246 to access the memory array 1230. It will be appreciated by those skilled in the art that the number of address input connections can depend on the density and architecture of the memory array 1230 and that the number of addresses can increase with both increased numbers of memory cells and increased numbers of memory blocks and arrays.

The memory array 1230 can include multilevel memory cells having different numbers of data states, sensing references, etc., according to embodiments described herein. The read/latch circuitry 1250 can read and latch a page or row of data from the memory array 1230. I/O circuitry 1260 can be included for bi-directional data communication over the I/O connections 1262 with the processor 1210. Write circuitry 1255 can be included to write data to the memory array 1230.

Control circuitry 1270 can decode signals provided by control connections 1272 from the processor 1210. These signals can include chip signals, write enable signals, and address latch signals that are used to control the operations on the memory array 1230, including data sensing, data write, and data erase operations. In one or more embodiments, the control circuitry 1270 can be responsible for executing instructions from the processor 1210 to perform the operations according to embodiments of the present disclosure. The control circuitry 1270 can be a state machine, a sequencer, or some other type of controller. It will be appreciated by those skilled in the art that additional circuitry and control signals can be provided, and that the memory device detail of FIG. 12 has been reduced to facilitate ease of illustration.

Figure 13:
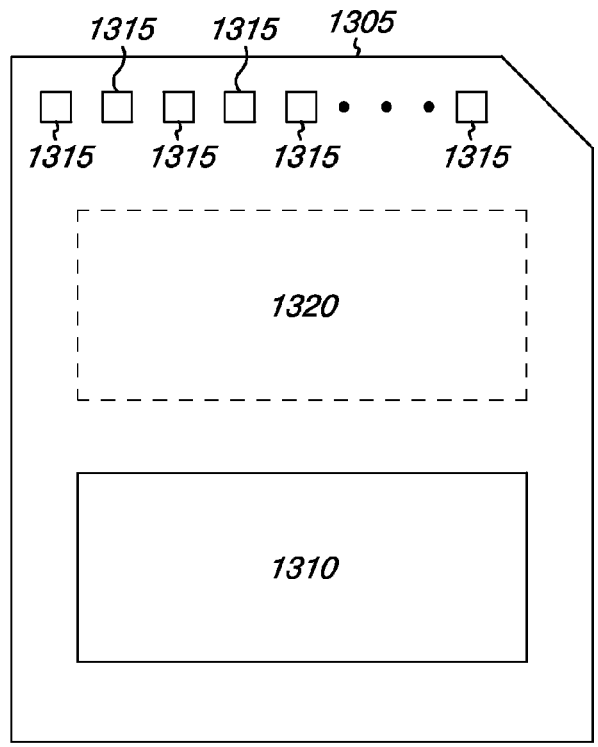
FIG. 13 is a functional block diagram of a memory module having at least one memory device in accordance with one or more embodiments of the present disclosure.

FIG. 13 is a functional block diagram of a memory module 1300 having at least one memory device 1310 in accordance with one or more embodiments of the present disclosure. Memory module 1300 is illustrated as a memory card, although the concepts discussed with reference to memory module 1300 are applicable to other types of removable or portable memory (e.g., USB interface drives) and are intended to be within the scope of "memory module" as used herein. In addition, although one example form factor is depicted in FIG. 13, these concepts are applicable to other form factors as well.

In one or more embodiments, memory module 1300 can include a housing 1305 (as depicted) to enclose one or more memory devices 1310, though such a housing is not essential to all devices or device applications. At least one memory device 1310 can include an array of multilevel memory cells that can be sensed according to embodiments described herein. Where present, the housing 1305 includes one or more contacts 1315 for communication with a host device. Examples of host devices include digital cameras, digital recording and playback devices, PDAs, personal computers, memory card readers, interface hubs and the like. For one or more embodiments, the contacts 1315 are in the form of a standardized interface. For example, with a USB interface drive, the contacts 1315 might be in the form of a USB Type-A male connector. In general, contacts 1315 can provide an interface for passing control, address and/or data signals between the memory module 1300 and a host having compatible receptors for the contacts 1315.

The memory module 1300 can optionally include additional circuitry 1320, which can be one or more integrated circuits and/or discrete components. For one or more embodiments, the additional circuitry 1320 can include control circuitry, such as a memory controller, for controlling access across multiple memory devices 1310 and/or for providing a translation layer between an external host and a memory device 1310. For example, there can not be a one-to-one correspondence between the number of contacts 1315 and a number of 1310 connections to the one or more memory devices 1310. Thus, a memory controller could selectively couple an I/O connection (not shown in FIG. 13) of a memory device 1310 to receive the appropriate signal at the appropriate I/O connection at the appropriate time or to provide the appropriate signal at the appropriate contact 1315 at the appropriate time. Similarly, the communication protocol between a host and the memory module 1300 can be different than what is required for access of a memory device 1310. A memory controller could then translate the command sequences received from a host into the appropriate command sequences to achieve the desired access to the memory device 1310. Such translation can further include changes in signal voltage levels in addition to command sequences.

The additional circuitry 1320 can further include functionality unrelated to control of a memory device 1310 such as logic functions as might be performed by an ASIC. Also, the additional circuitry 1320 can include circuitry to restrict read or write access to the memory module 1300, such as password protection, biometrics or the like. The additional circuitry 1320 can include circuitry to indicate a status of the memory module 1300. For example, the additional circuitry 1320 can include functionality to determine whether power is being supplied to the memory module 1300 and whether the memory module 1300 is currently being accessed, and to display an indication of its status, such as a solid light while powered and a flashing light while being accessed. The additional circuitry 1320 can further include passive devices, such as decoupling capacitors to help regulate power requirements within the memory module 1300.

CONCLUSION

Devices, methods, and systems for sensing memory, such as resistance variable memory, among other types of memory, have been described herein. One or more embodiments can include a method for generating currents to be used in sensing a memory cell, the method including providing a number of initial currents, and generating a number of reference currents by summing particular combinations of the initial currents.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for generating currents to be used in sensing a memory cell, comprising:
   providing a number of initial currents, wherein providing the number of initial currents includes providing at least three initial currents; and
   generating a number of reference currents by summing particular combinations of the initial currents, wherein generating the number of reference currents by summing particular combinations of the initial currents includes:
     generating a number of read reference currents, wherein generating the number of read reference currents includes generating at least three read reference currents; and
     generating a number of program reference currents, wherein generating the number of program reference currents includes generating at least two program reference currents.

2. The method of claim 1, including generating the number of read reference currents and the number of program reference currents with a same sense amplifier.

3. The method of claim 1, wherein providing the initial currents comprises providing temperature compensated initial currents.

4. The method of claim 3, wherein providing temperature compensated initial currents includes providing temperature compensated initial currents having unique temperature coefficients.

5. The method of claim 1, including providing the initial currents with bandgap circuitry.

6. A memory device, comprising:
   a number of initial current providers; and
   at least one sense circuit coupled to the number of initial current providers, wherein:
     the at least one sense circuit is configured to generate a number of reference currents, wherein the number of reference currents include:
       a number of read reference currents; and
       a number of program reference currents; and
     the number of reference currents are sums of particular combinations of initial currents provided by the number of initial current providers, wherein the number of initial currents provided by the number of initial current providers is less than a sum of the number of read reference currents and the number of program reference currents.

7. The device of claim 6, wherein the number of initial current providers include temperature compensation circuitry configured to adjust the initial currents provided by the number of initial current providers in response to a change in temperature.

8. The device of claim 7, wherein:
   the number of initial current providers include a pair of NMOS transistors; and
   the temperature compensation circuitry is configured to adjust a width ratio of the pair of NMOS transistors.

9. The device of claim 8, wherein the temperature compensation circuitry includes:
   a series of transistors coupled to the pair of NMOS transistors; and
   logic configured to adjust an output of the series of transistors.

10. The device of claim 6, further comprising sensing a resistance variable memory cell using at least one of the read reference currents and the program reference currents.

11. A method for generating currents to be used in sensing a memory cell, comprising:
    providing a number of initial currents; and
    generating a number of reference currents by summing particular combinations of the initial currents, wherein generating the number of reference currents by summing particular combinations of the initial currents includes:
      generating a number of read reference currents, wherein generating the read reference currents includes:
        generating a first read reference current by using a first initial current;
        generating a second read reference current by summing the first initial current and twice a second initial current; and
        generating a third read reference current by summing the first initial current, twice the second initial current, and twice a third initial current; and
      generating a number of program reference currents, wherein generating the program reference currents includes:
        generating a first program reference current by summing the first initial current and the second initial current; and
        generating a second program reference current by summing the first initial current, twice the second initial current, and the third initial current.

12. A method for generating currents to be used in sensing a memory cell, comprising:
    providing a number of initial currents; and
    generating a number of reference currents by summing particular combinations of the initial currents, wherein summing particular combinations of the initial currents includes:
      using logic to selectively turn on one or more transistors coupled to the initial currents; and
      summing one or more currents output from the one or more transistors which have been turned on.

13. A memory device, comprising:
    a number of initial current providers; and
    at least one sense circuit coupled to the number of initial current providers, wherein:
      the at least one sense circuit is configured to generate a number of reference currents, wherein the number of reference currents include:
        a number of read reference currents; and
        a number of program reference currents; and the number of reference currents are sums of particular combinations of initial currents provided by the number of initial current;
wherein:
a first read reference current is a first initial current;
a first program reference current is a sum of the first initial current and a second initial current;
a second read reference current is a sum of the first initial current and twice the second initial current;
a second program reference current is a sum of the first initial current, twice the second initial current, and a third initial current; and
a third read reference current is a sum of the first initial current, twice the second initial current, and twice the third initial current.

* * * * *